US012571094B2

(12) United States Patent　　　　　　　(10) Patent No.: US 12,571,094 B2
Nakatani et al.　　　　　　　　　　　　(45) Date of Patent: Mar. 10, 2026

(54) METHOD OF PROCESSING SUBSTRATE, SUBSTRATE PROCESSING APPARATUS, AND RECORDING MEDIUM

(71) Applicants:Kokusai Electric Corporation, Tokyo (JP); AIR WATER INC., Osaka (JP)

(72) Inventors: Kimihiko Nakatani, Toyama (JP); Yoshitomo Hashimoto, Toyama (JP); Yoshiro Hirose, Toyama (JP); Fumio Kawasaki, Matsumoto (JP); Yasunori Otsuka, Matsumoto (JP); Keisuke Nagata, Matsumoto (JP)

(73) Assignees: KOKUSAI ELECTRIC CORPORATION, Tokyo (JP); AIR WATER INC., Osaka (JP)

( * ) Notice: Subject to any disclaimer, the term of this patent is extended or adjusted under 35 U.S.C. 154(b) by 0 days.

(21) Appl. No.: 18/742,551

(22) Filed: Jun. 13, 2024

(65) Prior Publication Data

US 2024/0327976 A1　　Oct. 3, 2024

Related U.S. Application Data

(63) Continuation of application No. PCT/JP2022/042506, filed on Nov. 16, 2022.

(30) Foreign Application Priority Data

Dec. 17, 2021　(JP) ................................. 2021-205125

(51) Int. Cl.
　　*C23C 16/40*　　　(2006.01)
　　*B01J 31/02*　　　(2006.01)
　　(Continued)

(52) U.S. Cl.
　　CPC ......... *C23C 16/401* (2013.01); *B01J 31/0237* (2013.01); *C23C 16/0272* (2013.01); *C23C 16/45557* (2013.01)

(58) Field of Classification Search
　　CPC .............. C23C 16/401; C23C 16/0272; C23C 16/45557; C23C 16/0236; C23C 16/402;
　　　　　　(Continued)

(56) References Cited

U.S. PATENT DOCUMENTS

2014/0287595 A1*　9/2014　Shimamoto ............. C23C 16/56
　　　　　　　　　　　　　　　　438/774
2014/0287596 A1　　9/2014　Hirose et al.
　　　　　　(Continued)

FOREIGN PATENT DOCUMENTS

JP　　2014-183218 A　　9/2014
JP　　2014-183219 A　　9/2014
　　　　　(Continued)

OTHER PUBLICATIONS

International Search Report of PCT/JP2022/042506, Feb. 7, 2023, 2 pgs.
　　　　　(Continued)

*Primary Examiner* — Michael G Miller
(74) *Attorney, Agent, or Firm* — Volpe Koenig

(57) ABSTRACT

There is provided a technique that includes: providing a substrate including a conductive film and an insulating film on a surface of the substrate; and forming an oxide film on a surface of the insulating film, among the conductive film and the insulating film, by supplying a halogen-free precursor, an oxidizing agent, and a catalyst to the substrate under a non-plasma atmosphere.

20 Claims, 13 Drawing Sheets

(51) Int. Cl.
*C23C 16/02* (2006.01)
*C23C 16/455* (2006.01)

(58) Field of Classification Search
CPC .............. C23C 16/04; C23C 16/45534; C23C 16/45546; C23C 16/45553; B01J 31/0237; H01L 21/31; H01L 21/0228; H01L 21/02164; H01L 21/02214; H01L 21/02219; H01L 21/32
See application file for complete search history.

(56) References Cited

U.S. PATENT DOCUMENTS

| 2014/0287598 | A1 | | 9/2014 | Hirose et al. |
| 2015/0299848 | A1 | * | 10/2015 | Haukka .................... C23C 16/06 427/256 |
| 2017/0342553 | A1 | | 11/2017 | Yu et al. |
| 2019/0157076 | A1 | * | 5/2019 | Hausmann ............ H01L 21/321 |
| 2020/0020580 | A1 | * | 1/2020 | Lee ..................... H01L 21/0228 |

| 2020/0303185 | A1 | 9/2020 | Nakagawa et al. |
| 2020/0303186 | A1 | 9/2020 | Nakatani |
| 2021/0202245 | A1 | 7/2021 | Waseda et al. |

FOREIGN PATENT DOCUMENTS

| JP | 2015-165523 | A | 9/2015 |
| JP | 2017-222928 | A | 12/2017 |
| JP | 2020-015545 | A | 1/2020 |
| JP | 2020-155452 | A | 9/2020 |
| JP | 2020-155607 | A | 9/2020 |
| JP | 2021-504947 | A | 2/2021 |
| JP | 2021-106242 | A | 7/2021 |
| KR | 20140114776 | A | 9/2014 |
| KR | 20150119816 | A | 10/2015 |

OTHER PUBLICATIONS

Korean Office Action issued on Dec. 26, 2025 for Korean Patent Application No. 10-2024-7019605.

* cited by examiner

Natural oxide film

Film formation inhibition layer

Film formation inhibition layer

Oxide film

Conductive film

Insulating film

FIG. 5E

Oxide film

Conductive film    Insulating film

FIG. 9

METHOD OF PROCESSING SUBSTRATE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2022/042506, filed on Nov. 16, 2022, and designating the United States, the international application being based upon and claiming the benefit of priority from Japanese Patent Application No. 2021-205125, filed on Dec. 17, 2021, the entire content of which is incorporated herein by reference.

TECHNICAL FIELD

The present disclosure relates to a method of processing a substrate, a substrate processing apparatus, and a recording medium.

BACKGROUND

As one step in a manufacturing process of semiconductor devices in a related art, a film formation processing of selectively growing a film on a surface of a specific underlying film among multiple types of underlying films with different materials exposed at a substrate surface (hereinafter referred to as "selective growth" or "selective film formation") is performed.

However, film formation agents used when performing the selective growth, by-products generated at that time, etc. may react with the underlying films exposed at the substrate surface, and may corrode the underlying films depending on the materials of the underlying films, making the selective growth difficult as a result.

SUMMARY

Some embodiments of the present disclosure provide a technique that enables selective formation of a film on a desired surface with high precision.

According to embodiments of the present disclosure, there is provided a technique that includes providing a substrate including a conductive film and an insulating film on a surface of the substrate; and forming an oxide film on a surface of the insulating film, among the conductive film and the insulating film, by supplying a halogen-free precursor, an oxidizing agent, and a catalyst to the substrate under a non-plasma atmosphere.

BRIEF DESCRIPTION OF DRAWINGS

The accompanying drawings, which are incorporated in and constitute a part of the specification, illustrate embodiments of the present disclosure.

FIG. 5E is a cross-sectional schematic diagram illustrating the surface portion of the wafer after the film formation inhibition layer is removed from the surface of the conductive film, through a heat treatment step performed at the state of FIG. 5D.

FIG. 9 is a graph illustrating evaluation results in Example 2.

DETAILED DESCRIPTION

Figure 1:
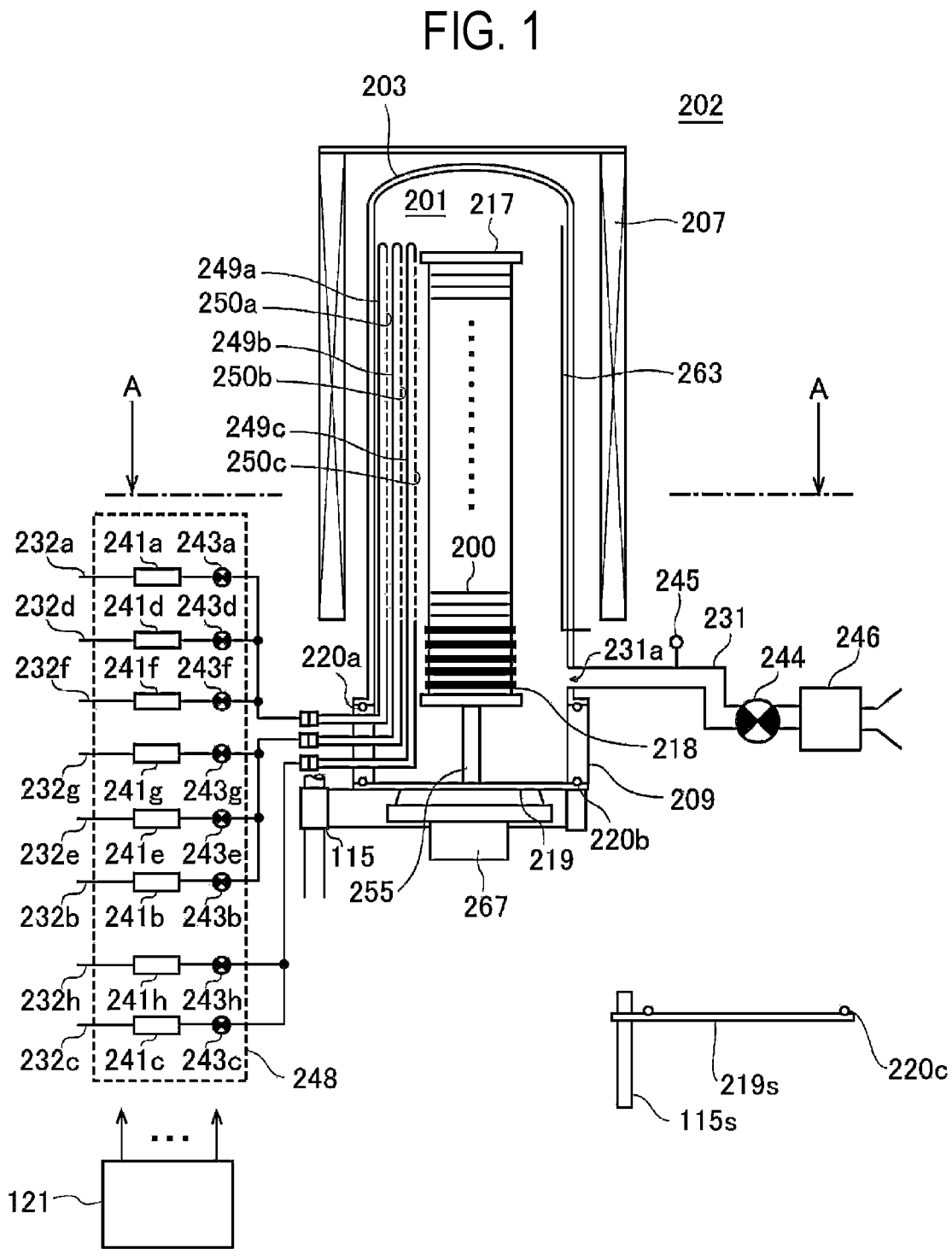
FIG. 1 is a schematic configuration diagram of a vertical process furnace of a substrate processing apparatus suitably used in embodiments of the present disclosure, and is illustrating a portion of the process furnace in a vertical cross-sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of Present Disclosure

Hereinafter, embodiments of the present disclosure will be described mainly with reference to FIGS. 1 to 4 and FIGS. 5A to 5E. In addition, the drawings used in the following description are schematic, and the dimensional relationships of each respective elements, the ratios of respective elements, etc. illustrated in the drawings may not correspond to actual ones. Further, the dimensional relationships of respective elements, the ratios of respective elements, etc. may not match among multiple drawings.

(1) Configuration of Substrate Processing Apparatus

As illustrated in FIG. 1, a process furnace 202 includes a heater 207 as a temperature adjuster (heating system). The heater 207 is formed in a cylindrical shape and is mounted vertically by being supported by a holding plate. The heater 207 also functions as an activator (exciter) that activates (excites) a gas with heat.

Inside the heater 207, a reaction tube 203 is disposed concentrically with the heater 207. The reaction tube 203 is made of a heat-resistant material such as quartz ($SiO_2$) or silicon carbide (SiC) and is formed in a cylindrical shape with a closed upper end and an opened lower end. Below the reaction tube 203, a manifold 209 is disposed concentrically with the reaction tube 203. The manifold 209 is made of a metallic material such as stainless steel (SUS) or the like, and takes the form of a cylinder with opened upper and lower ends. The upper end of the manifold 209 is engaged with the lower end of the reaction tube 203, thus being configured to support the reaction tube 203. An O-ring 220a is provided as a sealing member between the manifold 209 and the reaction tube 203. The reaction tube 203 is vertically mounted, similarly to the heater 207. The reaction tube 203 and manifold 209 mainly constitute a process container (reaction container). A process chamber 201 is formed in a cylindrical hollow region of the process container. The process chamber 201 is configured to accommodate wafers 200 as substrates. A processing of the wafers 200 is carried out within the process chamber 201.

Nozzles 249a to 249c are provided as first to third suppliers within the process chamber 201 so as to penetrate a sidewall of the manifold 209, respectively. The nozzles 249a to 249c are also referred to as first to third nozzles, respectively. The nozzles 249a to 249c are made of a heat-resistant material such as quartz or SiC. Gas supply pipes 232a to 232c are connected to the nozzles 249a to 249c, respectively. The nozzles 249a to 249c are different nozzles, respectively, and each of the nozzles 249a and 249c is located adjacent to the nozzle 249b.

Figure 2:
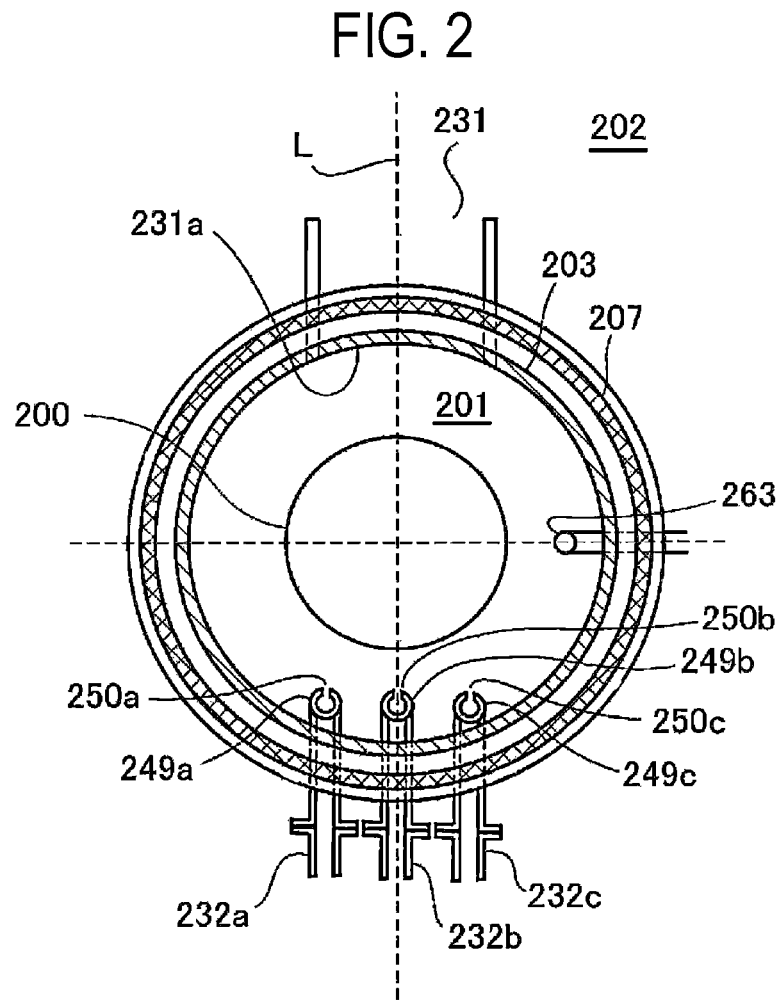
FIG. 2 is a schematic configuration diagram of the vertical process furnace of the substrate processing apparatus suitably used in the embodiments of the present disclosure, and is illustrating a portion of the process furnace in a cross-sectional view taken along line A-A of FIG. 1.

The gas supply pipes 232a to 232c are provided with mass flow controllers (MFCs) 241a to 241c as flow rate controllers (flow rate control parts) and valves 243a to 243c as opening/closing valves, respectively, in order from an upstream side of gas flow. Gas supply pipes 232d and 232f are each connected to the gas supply pipe 232a at a downstream side of the valve 243a. Gas supply pipes 232e and 232g are each connected to the gas supply pipe 232b at a downstream side of the valve 243b. A gas supply pipe 232h is connected to the gas supply pipe 232c at a downstream side of the valve 243c. The gas supply pipes 232d to 232h are provided with MFCs 241d to 241h and valves 243d to 243h, respectively, in order from the upstream side of gas flow. The gas supply pipes 232a to 232h are made of a metallic material such as SUS. As illustrated in FIG. 2, the nozzles 249a to 249c are provided in a space of an annular shape in a plane view between an inner wall of the reaction tube 203 and the wafers 200, so as to stand upright in an array direction of the wafers 200 from a lower portion to an upper portion of the inner wall of the reaction tube 203. In other words, the nozzles 249a to 249c are each provided along a wafer array area where the wafers 200 are arranged, on a side of the wafer array area, in an area horizontally surrounding the wafer array area. In a plane view, the nozzle 249b is positioned to face an exhaust port 231a, which will be described later, along a straight line with a center of the wafers 200 loaded into the process chamber 201 in between. The nozzles 249a and 249c are positioned to sandwich a line L, which passes through centers of the nozzle 249b and exhaust port 231a, between them along the inner wall of the reaction tube 203 (an outer periphery of the wafers 200). The line L is also a line passing through the centers of the nozzle 249b and wafers 200. In other words, it may also be said that the nozzle 249c is located at an opposite side of the nozzle 249a with the line L in between. The nozzles 249a and 249c are disposed linearly symmetrically with the line L as an axis of symmetry. Gas supply holes 250a to 250c are provided at side surfaces of the nozzles 249a to 249c, respectively, to supply gases. The gas supply holes 250a to 250c are each opened to oppose (face) the exhaust port 231a in a plane view, enabling the supply of gases toward the wafers 200. The gas supply holes 250a to 250c are provided in plural from a lower portion to an upper portion of the reaction tube 203.

A modifying agent is supplied from the gas supply pipe 232a into the process chamber 201 through the MFC 241a, valve 243a, and nozzle 249a.

A precursor is supplied from the gas supply pipe 232b into the process chamber 201 through the MFC 241b, valve 243b, and nozzle 249b. The precursor is used as one of film formation agents.

An oxidizing agent is supplied from the gas supply pipe 232c into the process chamber 201 through the MFC 241c, valve 243c, and nozzle 249c. The oxidizing agent is used as one of film formation agents.

A catalyst is supplied from the gas supply pipe 232d into the process chamber 201 through the MFC 241d, valve 243d, gas supply pipe 232a, and nozzle 249a. The catalyst is used as one of film formation agents.

A cleaning agent is supplied from the gas supply pipe 232e into the process chamber 201 through the MFC 241e, valve 243e, gas supply pipe 232b, and nozzle 249b.

An inert gas is supplied from the gas supply pipes 232f to 232h into the process chamber 201 through the MFCs 241f to 241h, valves 243f to 243h, gas supply pipes 232a to 232c, and nozzles 249a to 249c. The inert gas acts as a purge gas, carrier gas, dilution gas, etc.

The gas supply pipe 232a, MFC 241a, and valve 243a mainly constitute a modifying agent supply system. The gas supply pipe 232b, MFC 241b, and valve 243b mainly constitute a precursor supply system. The gas supply pipe 232c, MFC 241c, and valve 243c mainly constitute an oxidizing agent supply system. The gas supply pipe 232d, MFC 241d, and valve 243d mainly constitute a catalyst supply system. The gas supply pipe 232e, MFC 241e, and valve 243e mainly constitute a cleaning agent supply system. The gas supply pipes 232f to 232h, MFCs 241f to 241h, and valves 243f to 243h mainly constitute an inert gas supply system. The precursor supply system, oxidizing agent supply system, and catalyst supply system are each or collectively referred to as a film formation agent supply system.

Any of the various supply systems or the entire supply systems described above may be configured as an integrated supply system 248 where the valves 243a to 243h, MFCs 241a to 241h, etc. are integrated. The integrated supply system 248 is connected to each of the gas supply pipes 232a to 232h, and is configured such that supply operation of various substances (various gases) into the gas supply pipes 232a to 232h, i.e., opening/closing operation of the valves 243a to 243h and the flow rate regulating operation by the MFCs 241a to 241h, and the like are controlled by a controller 121, which will be described later. The integrated supply system 248 is configured as a monolithic or divided integrated unit, allowing for attachment or detachment of the gas supply pipes 232a to 232h, etc. at an integrated unit level. This enables maintenance, replacement, expansion, etc. of the integrated supply system 248 to be performed at the integrated unit level.

The exhaust port 231a is provided at a lower side a sidewall of the reaction tube 203 to exhaust an atmosphere in the process chamber 201. As illustrated in FIG. 2, the exhaust port 231*a*, in a plane view, is positioned to oppose (face) the nozzles 249*a* to 249*c* (gas supply holes 250*a* to 250*c*) with the wafers 200 in between. The exhaust port 231*a* may be provided along the sidewall of the reaction tube 203 from a lower portion to an upper portion thereof, i.e., along the wafer array area. An exhaust pipe 231 is connected to the exhaust port 231*a*. The exhaust pipe 231 is connected to a vacuum pump 246, which serves as a vacuum exhauster, through a pressure sensor 245, which serves as a pressure detector (pressure detection part) that detects a pressure inside the process chamber 201, and an auto pressure controller (APC) valve 244, which serves as a pressure regulator (pressure regulation part). The APC valve 244 is configured to perform vacuum-exhaust of an interior of the process chamber 201 or stop the vacuum-exhaust by being opened or closed while the vacuum pump 246 is in operation. The APC valve 244 is also configured to regulate pressure inside the process chamber 201 by adjusting a valve-opening state based on pressure information detected by the pressure sensor 245 while the vacuum pump 246 is in operation. The exhaust pipe 231, APC valve 244, and pressure sensor 245 mainly constitute an exhaust system. The vacuum pump 246 may also be considered as included in the exhaust system.

A seal cap 219 is provided as a furnace opening lid below the manifold 209 to airtightly close an opening at a lower end of the manifold 209. The seal cap 219 is made of a metallic material such as SUS and takes the form of a disc. An O-ring 220*b* is provided as a sealing member abutting against the lower end of the manifold 209 on an upper surface of the seal cap 219. A rotator 267 is installed below the seal cap 219 to rotate a boat 217 to be described later. A rotating shaft 255 of the rotator 267 passes through the seal cap 219 and is connected to the boat 217. The rotator 267 is configured to rotate the wafers 200 by rotating the boat 217. The seal cap 219 is configured to be vertically raised or lowered by a boat elevator 115, which serves as an elevator installed outside the reaction tube 203. The boat elevator 115 is configured as a transporter (transport mechanism) that loads and unloads (transports) the wafers 200 into and out of the process chamber 201 by raising or lowering the seal cap 219. The transporter functions as a providing device to provide the wafers 200 into the process chamber 201.

A shutter 219*s* is provided as a furnace opening lid below the manifold 209 to airtightly close the opening at the lower end of the manifold 209 in a state where the seal cap 219 is lowered and the boat 217 is unloaded out of the process chamber 201. The shutter 219*s* is made of a metallic material such as SUS and takes the form of a disc. An O-ring 220*c* is provided as a sealing member abutting against the lower end of the manifold 209 on an upper surface of the shutter 219*s*. The opening/closing operation (such as an elevating operation or pivoting operation) of the shutter 219*s* is controlled by a shutter opening/closing mechanism 115*s*.

The boat 217, which serves as a substrate support, is configured to vertically align and support a plurality of wafers 200, for example, ranging from 25 to 200, in multiple stages, i.e., arrange the wafers 200 at intervals, while keeping them in a horizontal posture with centers thereof aligned with one another. The boat 217 is made of a heat-resistant material such as quartz or SiC. Heat insulating plates 218, which are made of a heat-resistant material such as quartz or SiC, are supported in multiple stages at a lower portion of the boat 217.

A temperature sensor 263 is installed as a temperature detector within the reaction tube 203. A temperature inside the process chamber 201 becomes a desired temperature distribution by regulating a state of supply of electric power to the heater 207 based on temperature information detected by the temperature sensor 263. The temperature sensor 263 is provided along the inner wall of the reaction tube 203.

Figure 3:
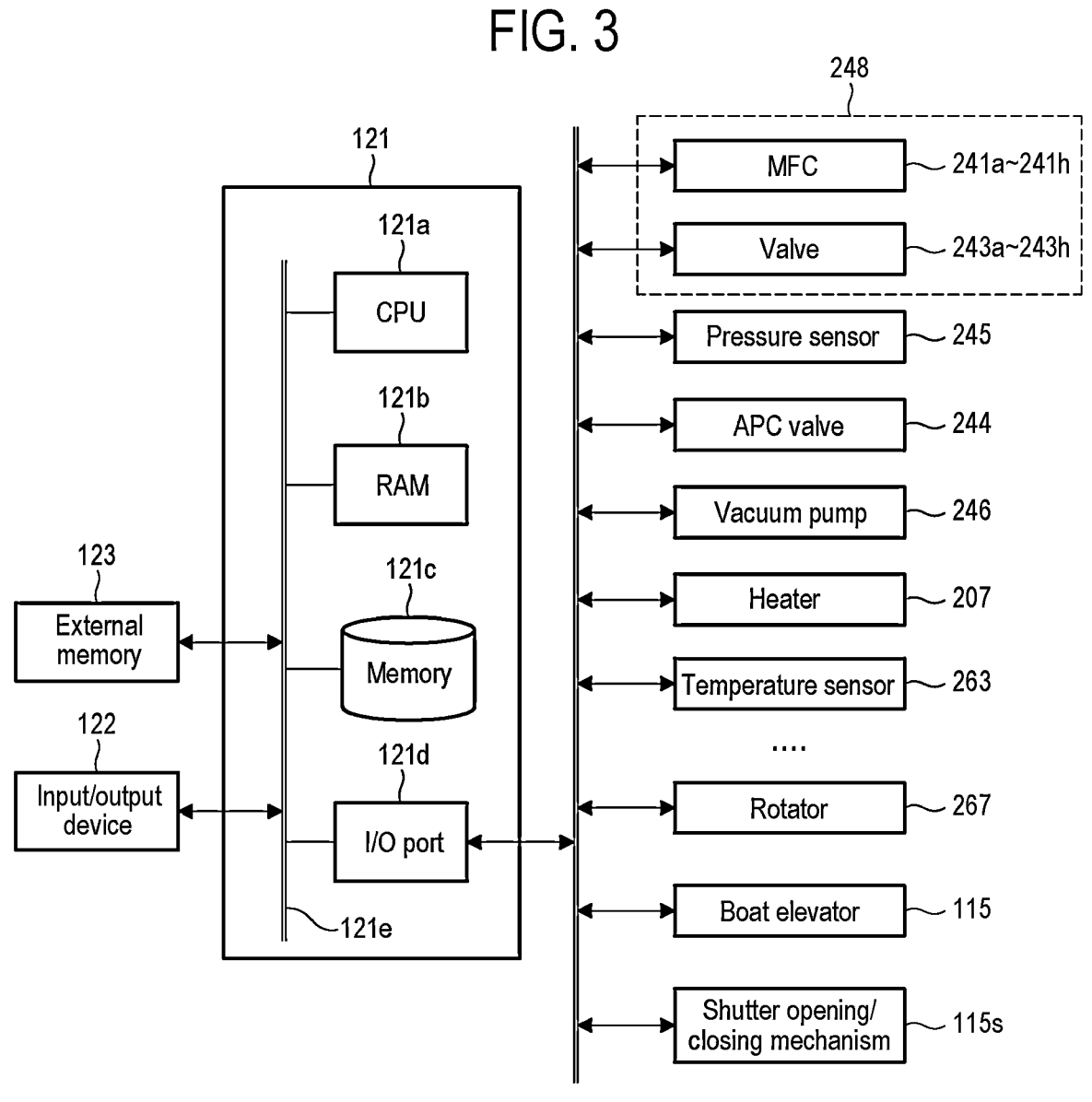
FIG. 3 is a schematic configuration diagram of a controller of the substrate processing apparatus suitably used in the embodiments of the present disclosure, and is illustrating a control system of the controller in a block diagram.

As illustrated in FIG. 3, the controller 121, which is a control part (control means), is configured as a computer including a central processing unit (CPU) 121*a*, random access memory (RAM) 121*b*, memory 121*c*, and I/O port 121*d*. The RAM 121*b*, memory 121*c*, and I/O port 121*d* are configured to be capable of exchanging data with the CPU 121*a* via an internal bus 121*e*. An input/output device 122, which is configured as, for example, a touch panel or the like is connected to the controller 121. Further, it is possible to connect an external memory 123 to the controller 121.

The memory 121*c* includes, for example, a flash memory, hard disk drive (HDD), solid state drive (SSD), etc. The memory 121*c* stores, in a readable manner, control programs for controlling operations of a substrate processing apparatus, process recipes describing procedures, conditions, etc. of substrate processing as described later, etc. The process recipes are combinations that cause, by the controller 121, the substrate processing apparatus to execute each procedure in substrate processing as described later to achieve predetermined results, thus functioning as programs. Hereinafter, the process recipes, control programs, etc. are collectively referred to simply as "programs." Further, the process recipes are simply referred to as "recipes." The term "programs" as used herein may refer to a case of including the recipes, a case of including the control programs, or a case of including both of them. The RAM 121*b* is configured as a memory area (work area) where programs, data, etc. read by the CPU 121*a* are temporarily held.

The I/O port 121*d* is connected to the aforementioned MFCs 241*a* to 241*h*, valves 243*a* to 243*h*, pressure sensor 245, APC valve 244, vacuum pump 246, temperature sensor 263, heater 207, rotator 267, boat elevator 115, shutter opening/closing mechanism 115*s*, etc.

The CPU 121*a* is configured to read and execute the control programs from the memory 121*c* and to read the recipes from the memory 121*c* in response to, e.g., an input of operation commands from the input/output device 122. The CPU 121*a* is configured to control, based on the contents of the read recipes, the flow rate regulating operations of various substances (various gases) by the MFCs 241*a* to 241*h*, the opening/closing operations of the valves 243*a* to 243*h*, the pressure regulating operation by the APC valve 244 based on the opening/closing operations of the APC valve 244 and the pressure sensor 245, the startup and shutdown of the vacuum pump 246, the temperature regulating operation of the heater 207 based on the temperature sensor 263, the rotation and rotational speed adjusting operation of the boat 217 by the rotator 267, the elevating operation of the boat 217 by the boat elevator 115, the opening/closing operations of the shutter 219*s* by the shutter opening/closing mechanism 115*s*, etc.

The controller 121 may be configured by installing the aforementioned programs stored in the external memory 123 onto the computer. The external memory 123 includes a magnetic disk such as HDD, an optical disk such as CD, a magneto-optical disk such as MO, a semiconductor memory such as USB memory or SSD, etc. The memory 121*c* and external memory 123 are configured as computer-readable recording media. Hereinafter, these are collectively referred to simply as "recording medium." The term "recording medium" as used herein may refer to a case including the memory 121*c*, a case including the external memory 123, or a case including both of them. In addition, providing programs to the computer may be done by using a communication means such as the Internet or a dedicated line without using the external memory 123.

(2) Substrate Processing Process

As one step in the manufacturing process of semiconductor devices using the above-described substrate processing apparatus, a substrate processing method, i.e., an example processing sequence for selectively forming a film on a surface of an insulating film serving as a second underlying film, among a conductive film serving as a first underlying film and the insulating film serving as the second underlying film that are exposed on a surface of the wafer 200 serving as a substrate, will be described mainly with reference to FIGS. 4 and 5A to 5E. In the following description, for convenience, a case where the conductive film as the first underlying film is made of, for example, a copper film (Cu film) and the insulating film as the second underlying film is made of, for example, a silicon oxide film (SiO$_2$ film, hereinafter also referred to as SiO film) will be described as a representative example. In the following description, the operation of each part constituting the substrate processing apparatus is controlled by the controller 121.

The processing sequence of the embodiments of the present disclosure includes the following steps:

providing the wafer 200 including a conductive film and an insulating film exposed on a surface of the wafer 200; and selectively forming an oxide film on a surface of the insulating film, among the conductive film and insulating film, by supplying a halogen-free precursor, an oxidizing agent, and a catalyst to the wafer 200 under a non-plasma atmosphere.

Figure 4:
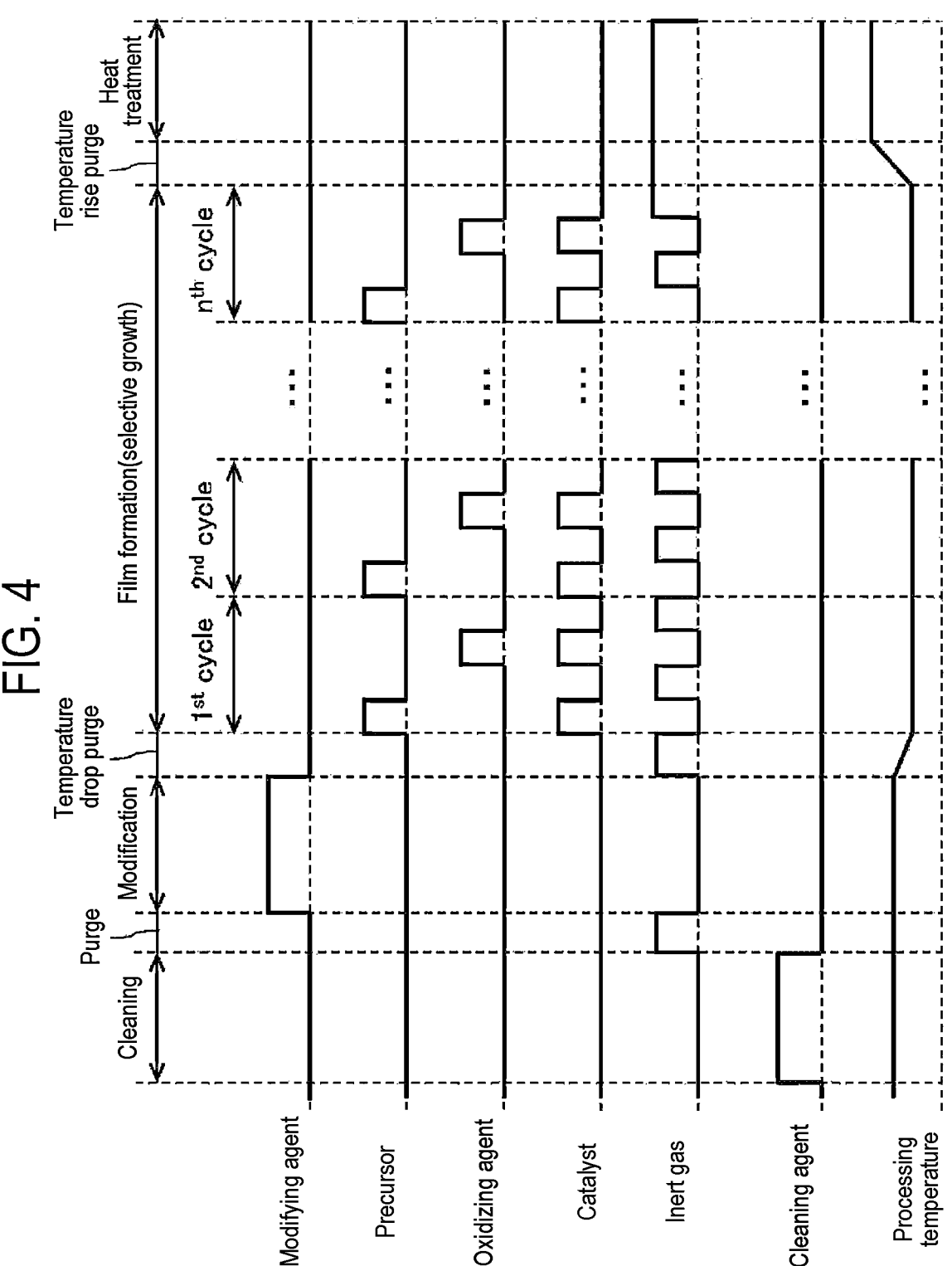
FIG. 4 is a diagram illustrating a processing sequence according to the embodiments of the present disclosure.

In addition, as illustrated in FIG. 4, in the oxide film formation step, a cycle, including a step of supplying the precursor to the wafer 200 and a step of supplying the oxidizing agent to the wafer 200, is performed a predetermined number of times. The catalyst may be supplied to the wafer 200 in at least one selected from the group of the precursor supply step and the oxidizing agent supply step. In addition, FIG. 4 illustrates, as a representative example, supplying the catalyst in both the precursor supply step and the oxidizing agent supply step. Further, as illustrated in FIG. 4, it is also permissible to perform a step of selectively forming a film formation inhibition layer on a surface of the conductive film, among the conductive film and insulating film, by supplying a modifying agent to the wafer 200 before the oxide film formation step. In the film formation inhibition layer formation step, it is desirable to supply the modifying agent under a non-plasma atmosphere.

In other words, the processing sequence illustrated in FIG. 4 exemplifies performing, under a non-plasma atmosphere, the following steps:

selectively forming a film formation inhibition layer on a surface of the conductive film, among the conductive film and the insulating film, by supplying a modifying agent to the wafer 200; and selectively forming the oxide film on the surface of the insulating film, among the conductive film and the insulating film, by performing a cycle, including a step of supplying the precursor and the catalyst to the wafer 200 and a step of supplying the oxidizing agent and the catalyst to the wafer 200, a predetermined number of times (n times, where n is an integer greater than or equal to 1).

The above-described processing sequence herein may also be represented as follows for convenience. The same notation is also used in the description of the following modifications and other embodiments.

Modifying Agent→(Precursor+Catalyst→Oxidizing
Agent+Catalyst)×$n$

In addition, it is also permissible to supply the catalyst to the wafer 200 in at least one selected from the group of the precursor supply step and the oxidizing agent supply step, as in the following processing sequence.

Modifying Agent→(Precursor→Oxidizing Agent+
Catalyst)×$n$

Modifying Agent→(Precursor+Catalyst→Oxidizing
Agent)×$n$

Further, as the processing sequence illustrated in FIG. 4 and described below, it is also permissible to perform a step of removing a natural oxide film formed on the surface of the wafer 200 by supplying a cleaning agent to the wafer 200 before the film formation inhibition layer formation step.

Cleaning Agent→Modifying Agent→(Precursor+
Catalyst→Oxidizing Agent+Catalyst)×$n$ Cleaning Agent→Modifying Agent→(Precurso-
r→Oxidizing Agent+Catalyst)×$n$ Cleaning Agent→Modifying Agent→(Precursor+
Catalyst→Oxidizing Agent)×$n$ The term "wafer" as used herein may refer to "a wafer itself" or "a stack including a wafer and a predetermined layer or film formed on a surface of a wafer." The term "a surface of a wafer" as used herein may refer to "a surface of a wafer itself" or "a surface of a predetermined layer, etc. formed on a wafer." When it is stated herein "forming a predetermined layer on a wafer," it may refer to "directly forming a predetermined layer on a surface of a wafer itself" or "forming a predetermined layer on top of a layer, etc. formed on a wafer." The term "substrate" as used herein is equivalent to the term "wafer."

The term "agent" as used herein includes at least one selected from the group of a gaseous substance and a liquid substance. The liquid substance includes a mist-like substance. In other words, each of the modifying agent and film formation agent (precursor, oxidizing agent, and catalyst) may include a gaseous substance, may include a liquid substance such as a mist-like substance, or may include both.

The term "layer" as used herein includes at least one selected from the group of a continuous layer and a discontinuous layer. For example, the film formation inhibition layer may include either a continuous layer or a discontinuous layer, or both, as long as it is capable of exerting a film formation inhibition effect.

(Wafer Charge and Boat Loading)

Once a plurality of wafers 200 are charged onto the boat 217 (wafer charge), the shutter 219$s$ is moved by the shutter opening/closing mechanism 115$s$, so that the opening at the lower end of the manifold 209 is opened (shutter opening). Subsequently, as illustrated in FIG. 1, the boat 217 supporting the plurality of wafers 200 is lifted by the boat elevator 115 and is loaded into the process chamber 201 (boat loading). In this state, the seal cap 219 seals the lower end of the manifold 209 via the O-ring 220$b$. In this way, the wafers 200 are provided into the process chamber 201.

Figure 5A:
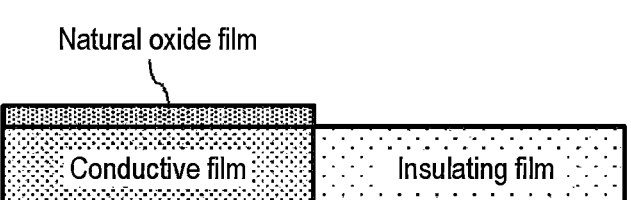
FIG. 5A is a cross-sectional schematic diagram illustrating a surface portion of a wafer including a conductive film and an insulating film on a surface thereof, with a natural oxide film formed on a surface of the conductive film.

In addition, the wafers 200 loaded onto the boat 217 each include a conductive film as a first underlying film and an insulating film as a second underlying film on a surface thereof, as illustrated in FIG. 5A. As described above, the conductive film is made of, for example, a Cu film, and the insulating film is made of, for example, a SiO film. Further, a natural oxide film is formed on a surface of the conductive film, as illustrated in FIG. 5A.

(Pressure Regulation and Temperature Regulation)

After the boat loading is completed, the interior of the process chamber 201, i.e., a space where the wafers 200 exist, is vacuum-exhausted (depressurized) by the vacuum pump 246 to reach a desired pressure (degree of vacuum). At this time, the pressure inside the process chamber 201 is measured by the pressure sensor 245, and the APC valve 244 is feedback-controlled based on the pressure information measured. Further, the wafers 200 in the process chamber 201 are heated by the heater 207 to reach a desired processing temperature. At this time, the state of supply of electric power to the heater 207 is feedback-controlled based on the temperature information detected by the temperature sensor 263 to achieve a desired temperature distribution in the process chamber 201. Further, rotation of the wafers 200 is initiated by the rotator 267. The exhaust of the process chamber 201 and the heating and rotation of the wafers 200 continue at least until the wafers 200 are completely processed.

(Cleaning Step)

Subsequently, a cleaning agent is supplied to the wafer 200.

Specifically, the valve 243e is opened to flow the cleaning agent into the gas supply pipe 232e. The cleaning agent is regulated in flow rate by the MFC 241e, is supplied into the process chamber 201 through the gas supply pipe 232b and nozzle 249b, and is exhausted from the exhaust port 231a. At this time, the cleaning agent is supplied to the wafer 200 from a side of the wafer 200 (cleaning agent supply). At this time, it is also permissible to open the valves 243f to 243h to supply an inert gas into the process chamber 201 through the respective nozzles 249a to 249c.

Figure 5B:
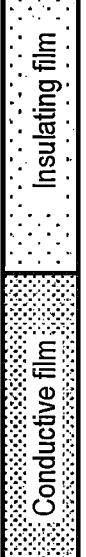
FIG. 5B is a cross-sectional schematic diagram illustrating the surface portion of the wafer after the natural oxide film is removed from the surface of the conductive film, through a cleaning step performed at the state of FIG. 5A.

By supplying the cleaning agent to the wafer 200 under a processing condition described later, the natural oxide film formed on the surface of the conductive film may be removed (etched), exposing the surface of the conductive film, as illustrated in FIG. 5B. In addition, if the insulating film is not an oxide film such as SiO film, there may also be a natural oxide film formed on a surface of the insulating film. In this case, the natural oxide film formed on the surface of the insulating film may also be removed (etched), exposing the surface of the insulating film.

The processing condition during the supply of the cleaning agent in the cleaning step is exemplified as follows:

Processing temperature: 50 to 200 degrees C., particularly 70 to 150 degrees C.;

Processing pressure: 10 to 2000 Pa, particularly 100 to 1500 Pa;

Cleaning agent supply flow rate: 0.05 to 1 slm, particularly 0.1 to 0.5 slm;

Cleaning agent supply time: 10 to 60 minutes, particularly 30 to 60 minutes; and Inert gas supply flow rate (for each gas supply pipe): 1 to 10 slm, particularly 2 to 10 slm.

In addition, the notation of numerical ranges such as "50 to 200 degrees C." herein refers that a lower limit and an upper limit are included in that range. Therefore, for example, "50 to 200 degrees C." refers to "50 degrees C. or more and 200 degrees C. or less." This applies similarly to other numerical ranges. Further, the processing temperature herein refers to the temperature of the wafer 200, or the temperature inside the process chamber 201, and the processing pressure refers to the pressure inside the process chamber 201. Further, if the supply flow rate includes 0 slm, "0 slm" refers to a case where said substance (gas) is not supplied. This applies similarly to the description below.

After the natural oxide film is removed from the surface of the conductive film to expose the surface of the conductive film, the valve 243e is closed, stopping the supply of the cleaning agent into the process chamber 201. Then, the interior of the process chamber 201 is vacuum-exhausted, removing a residual gaseous substance, etc., from the interior of the process chamber 201. At this time, the valves 243f to 243h are opened to supply an inert gas into the process chamber 201 through the nozzles 249a to 249c. The inert gas supplied from the nozzles 249a to 249c acts as a purge gas, thereby purging the interior of the process chamber 201 (purge).

A processing condition during purge in the cleaning step is exemplified as follows:

Processing pressure: 1 to 30 Pa;

Inert gas supply flow rate (for each gas supply pipe): 0.5 to 20 slm; and

Inert gas supply time: 1 to 120 seconds, particularly 1 to 60 seconds.

In addition, a processing temperature during purge in this step may be the same as the processing temperature during the supply of the cleaning agent.

As for the cleaning agent, for example, an acetic acid (CH$_3$COOH) gas, formic acid (HCOOH) gas, hexafluoroacetylacetone (C$_5$H$_2$F$_6$O$_2$) gas, hydrogen (H$_2$) gas, etc. may be used. In addition to these, for example, an acetic acid aqueous solution, formic acid aqueous solution, hydrofluoric (HF) aqueous solution, etc. may also be used as the cleaning agent. In other words, the cleaning agent may be either a gaseous substance or a liquid substance. Further, the cleaning agent may be a liquid substance such as mist-like substance. One or more of these may be used as the cleaning agent.

As for the inert gas, for example, rare gases such as nitrogen (N$_2$) gas, argon (Ar) gas, helium (He) gas, neon (Ne) gas, and xenon (Xe) gas may be used. One or more of these may be used as the inert gas. This applies similarly to each step described later.

In addition, before the loading of the wafer 200 into the process chamber 201, it is also permissible to perform the cleaning step on the wafer 200 in advance using a different substrate processing apparatus (ex-situ) from said substrate processing apparatus, thus removing the natural oxide film from the surface of the conductive film and exposing the surface of the conductive film. In this case, if the insulating film is not an oxide film such as SiO film, it is desirable to also remove the natural oxide film formed on the surface of the insulating film, exposing the surface of the insulating film. In addition, if the natural oxide film is already removed from the surface of the conductive film or insulating film, thus exposing the surface, the cleaning step may be omitted.

Modification Step

After the cleaning step, a modifying agent is supplied to the wafer 200.

Specifically, the valve 243a is opened to flow the modifying agent into the gas supply pipe 232a. The modifying agent is regulated in flow rate by the MFC 241a, is supplied into the process chamber 201 through the nozzle 249a, and is exhausted from the exhaust port 231a. At this time, the modifying agent is supplied to the wafer 200 from the side of the wafer 200 (modifying agent supply). At this time, it is also permissible to open the valves 243*f* to 243*h* to supply an inert gas into the process chamber 201 through the respective nozzles 249*a* to 249*c*.

Figure 5C:
FIG. 5C is a cross-sectional schematic diagram illustrating the surface portion of the wafer after a film formation inhibition layer is formed on the surface of the conductive film, through a modification step performed at the state of FIG. 5B.

By supplying the modifying agent to the wafer 200 under a processing condition described later, the surface of the conductive film may be modified to form a film formation inhibition layer by adsorbing at least a part of the molecular structure of molecules constituting the modifying agent onto the surface of the conductive film, as illustrated in FIG. 5C. In other words, by supplying the modifying agent that reacts with the conductive film to the wafer 200 under the processing condition described later, the surface of the conductive film may be modified to form a film formation inhibition layer (adsorption inhibition layer) by chemically adsorbing at least a part of the molecular structure of the molecules constituting the modifying agent onto the surface of the conductive film. This allows an outermost surface of the conductive film to be terminated by at least a part of the molecular structure of the molecules constituting the modifying agent. For example, if the modifying agent contains hydrocarbon groups, the film formation inhibition layer contains hydrocarbon-group terminations, and the outermost surface of the conductive film is terminated by the hydrocarbon groups. If the hydrocarbon groups are, for example, alkyl groups, i.e., if the modifying agent contains alkyl groups, the film formation inhibition layer contains alkyl-group terminations, and the outermost surface of the conductive film is terminated by the alkyl groups.

In addition, a reactivity between the modifying agent and the surface of the conductive film in this step may be higher than a reactivity between the modifying agent and the surface of the insulating film. In other words, it is desirable to use, as the modifying agent, a substance that possesses higher reactivity with the surface of the conductive film than with the surface of the insulating film. This allows for the selective formation of the film formation inhibition layer on the surface of the conductive film among the conductive film and insulating film.

The film formation inhibition layer formed in this step contains at least a part of the molecular structure of the molecules constituting the modifying agent, which is a residue derived from the modifying agent. The film formation inhibition layer prevents an adsorption of the precursor (film formation agent) onto the surface of the conductive film, thus inhibiting (preventing) the progress of a film formation reaction on the surface of the conductive film in a film formation step described later.

At least a part of the molecular structure of the molecules constituting the modifying agent, i.e., the residue derived from the modifying agent, may be, for example, hydrocarbon groups. In this case, the outermost surface of the conductive film is terminated by the hydrocarbon groups. If the hydrocarbon groups as the residue derived from the modifying agent are, for example, alkyl groups, the outermost surface of the conductive film is terminated by the alkyl groups. The hydrocarbon groups such as alkyl groups, which terminate the outermost surface of the conductive film, constitute the film formation inhibition layer, and prevent the adsorption of the precursor (film formation agent) onto the surface of the conductive film, thus enabling the inhibition (prevention) of the progress of the film formation reaction on the surface of the conductive film in the film formation step described later.

Herein, the film formation inhibition layer (also referred to as "film-formation-prevention layer") is sometimes called an inhibitor due to a film formation inhibition action thereof.

In addition, the term "inhibitor" as used herein may refer to the film formation inhibition layer, as well as to the modifying agent or the residue derived from the modifying agent, such as at least a part of the molecular structure of the molecules constituting the modifying agent, and may also be used as a collective term to refer to them in its entirety.

In addition, in this step, while at least a part of the molecular structure of the molecules constituting the modifying agent may be adsorbed onto a part of the surface of the insulating film, an amount of adsorption is minimal, as compared with an overwhelmingly great amount of adsorption onto the surface of the conductive film. Such selective (preferential) adsorption is made possible because the processing condition in this step is such that the modifying agent does not undergo vapor-phase decomposition within the process chamber 201. Further, using, as the modifying agent, a substance that possesses higher reactivity with the surface of the conductive film than with the surface of the insulating film contributes to this selective adsorption. In this step, since the modifying agent does not undergo vapor-phase decomposition within the process chamber 201, at least a part of the molecular structure of the molecules constituting the modifying agent is not deposited in multi-layer on the surface of the insulating film, and at least a part of the molecular structure of the molecules constituting the modifying agent is selectively adsorbed onto the surface of the conductive film among the conductive film and insulating film. This allows the surface of the conductive film to be selectively terminated by at least a part of the molecular structure of the molecules constituting the modifying agent.

The processing condition during the supply of the modifying agent in the modification step is exemplified as follows:

Processing temperature: room temperature (25 degrees C.) to 300 degrees C., particularly 60 to 100 degrees C.;

Processing pressure: 1 to 2000 Pa, particularly 10 to 1000 Pa;

Modifying agent supply flow rate: 0.001 to 2 slm, particularly 0.01 to 0.5 slm;

Modifying agent supply time: 1 second to 60 minutes, particularly 1 to 12 minutes; and Inert gas supply flow rate (for each gas supply pipe): 0 to 20 slm.

After the film formation inhibition layer is selectively formed on the surface of the conductive film, the valve 243*a* is closed, stopping the supply of the modifying agent into the process chamber 201. Then, through the same processing procedures and processing condition as those in the above-described purge, a residual gaseous substance, etc. in the process chamber 201 is excluded from the interior of the process chamber 201 (purge). In addition, a processing temperature during purge in this step may be the same as the processing temperature during the supply of the modifying agent.

As for the modifying agent, for example, a thiol compound may be used. The thiol compound is an organic compound containing hydrogenated sulfur(S) and possesses a chemical structure represented by the general formula R—SH (where R is organic groups such as hydrocarbon groups). R in R—SH includes, for example, alkyl groups ($-C_nH_{2n+1}$, where n is an integer from 1 to 24) or alkylene groups ($-(CH_2)_n-$, where n is an integer from 1 to 24). As for the thiol compound, for example, dodecanethiol ($CH_3(CH_2)_{11}SH$, abbreviation: DDT), tetradecanethiol ($CH_3(CH_2)_{13}SH$, abbreviation: TDT), hexadecanethiol ($CH_3(CH_2)_{15}SH$, abbreviation: HDT), octadecanethiol ($CH_3$ $(CH_2)_{17}SH$, abbreviation: ODT), etc. may be used. One or more of these may be used as the modifying agent.

Further, for example, a phosphonic acid compound may be used as the modifying agent. The phosphonic acid compound is an organic phosphorus compound containing phosphorus (P) oxo acid as a parent compound, and possesses a chemical structure represented by the general formula $R$—$PO(OH)_2$ (where R is organic groups such as hydrocarbon groups). R in $R$—$PO(OH)_2$ includes, for example, alkyl groups (—$C_nH_{2n+1}$, where n is an integer from 1 to 24) or alkylene groups (—$(CH_2)_n$—, where n is an integer from 1 to 24). As for the phosphonic acid compound, for example, dodecylphosphonic acid ($CH_3(CH_2)_{11}$ $PO(OH)_2$, abbreviation: DDPA), tetradecylphosphonic acid ($CH_3(CH_2)_{13}PO(OH)_2$, abbreviation: TDPA), hexadecylphosphonic acid ($CH_3(CH_2)_{15}PO(OH)_2$, abbreviation: HDPA), octadecylphosphonic acid ($CH_3(CH_2)_{17}PO(OH)_2$, abbreviation: ODPA), etc. may be used. One or more of these may be used as the modifying agent.

(Film Formation Step)

After the modification step, a halogen-free precursor, an oxidizing agent, and a catalyst are supplied as film formation agents to the wafer 200 under a non-plasma atmosphere, thereby forming an oxide film on the surface of the insulating film. In other words, a film is selectively (preferentially) formed on the surface of the insulating film by supplying film formation agents that react with the surface of the insulating film to the wafer 200. Specifically, the following precursor supply step and oxidizing agent supply step are sequentially performed. In each step, an output of the heater 207 is regulated to maintain the temperature of the wafer 200 to be equal to or less than the temperature of the wafer 200 in the modification step, particularly to be less than the temperature of the wafer 200 in the modification step, as illustrated in FIG. 4.

[Precursor Supply Step]

In this step, a precursor (precursor gas) and a catalyst (catalytic gas) are supplied as film formation agents to the wafer 200, which was subjected to the modification step, i.e., the selective formation of the film formation inhibition layer on the surface of the conductive film.

Specifically, the valves 243b and 243d are opened to flow the precursor and catalyst into the gas supply pipes 232b and 232d, respectively. The precursor and catalyst are regulated in flow rate by the MFCs 241b and 241d, respectively, are supplied into the process chamber 201 through the nozzles 249b and 249a, are mixed within the process chamber 201, and are exhausted from the exhaust port 231a. At this time, the precursor and catalyst are supplied to the wafer 200 from the side of the wafer 200 (precursor+catalyst supply). At this time, it is also permissible to open the valves 243f to 243h to supply an inert gas into the process chamber 201 through the respective nozzles 249a to 249c.

By supplying the precursor and catalyst to the wafer 200 under a processing condition described later, it becomes possible to selectively chemically adsorb at least a part of the molecular structure of molecules constituting the precursor onto the surface of the insulating film while preventing chemical adsorption of at least a part of the molecular structure of the molecules constituting the precursor onto the surface of the conductive film. This allows for a selective formation of a first layer on the surface of the insulating film. The first layer contains at least a part of the molecular structure of the molecules constituting the precursor, which is a residue of the precursor. In other words, the first layer contains at least a part of atoms constituting the precursor.

In addition, the selective chemical adsorption of at least a part of the molecular structure of the molecules constituting the precursor onto the surface of the insulating film is facilitated by several factors, including the presence of the film formation inhibition layer on the surface of the conductive film, the presence of Si—OH terminations (adsorption sites) on the surface of the insulating film, and the absence of Si—OH terminations (adsorption sites) on the surface of the conductive film. In other words, the presence of Si—OH terminations on the surface of the insulating film promotes the adsorption of at least a part of the molecular structure of the molecules constituting the precursor onto the surface of the insulating film. On the other hand, the formation of the film formation inhibition layer on the surface of the conductive film and the absence of Si—OH terminations on the surface of the conductive film may prevent the adsorption of at least a part of the molecular structure of the molecules constituting the precursor onto the surface of the conductive film. This lower reactivity between the precursor and the surface of the conductive film compared to a reactivity between the precursor and the surface of the insulating film is one of the factors that enable the selective chemical adsorption of at least a part of the molecular structure of the molecules constituting the precursor onto the surface of the insulating film. In addition, while the first layer formed on the surface of the insulating film in the precursor supply step may be changed into a second layer in the oxidizing agent supply step, a state where the surface of the second layer contains Si—OH terminations and the surface of the conductive film does not contain Si—OH terminations is maintained. Therefore, the same selective chemical adsorption proceeds in subsequent cycles, similar to the first cycle.

In this step, by supplying the catalyst along with the precursor, the above-described reaction may proceed under a non-plasma atmosphere and under a low-temperature condition described later. Thus, by forming the first layer under a non-plasma atmosphere and under a low-temperature condition described later, it becomes possible to maintain the molecules or atoms constituting the film formation inhibition layer formed on the surface of the conductive film without causing disappearance (desorption) thereof from the surface of the conductive film.

Further, by forming the first layer under a non-plasma atmosphere and under a low-temperature condition described later, it becomes possible to prevent thermal decomposition (vapor-phase decomposition), i.e., self-decomposition of the precursor within the process chamber 201. Thus, it becomes possible to prevent destruction (desorption, removal, neutralization) of the film formation inhibition layer caused by the decomposed active precursor. Further, this may prevent multi-layer deposition of at least a part of the molecular structure of the molecules constituting the precursor on the surface of the conductive film and the surface of the insulating film, allowing for selective adsorption of at least a part of the molecular structure of the molecules constituting the precursor onto the surface of the insulating film. In other words, the formation of the first layer under a non-plasma atmosphere and under a processing condition where the precursor does not self-decompose is also one of the factors that enable the selective chemical adsorption of at least a part of the molecular structure of the molecules constituting the precursor onto the surface of the insulating film.

In addition, in this step, while at least a part of the molecular structure of the molecules constituting the precursor may be adsorbed onto a part of the surface of the conductive film, an amount of adsorption is extremely minimal, thus being significantly less than an amount of adsorption of at least a part of the molecular structure of the molecules constituting the precursor onto the surface of the insulating film. Such selective (preferential) adsorption is made possible because the processing condition in this step is a non-plasma condition as well as a low-temperature condition as described later, ensuring that the precursor does not undergo vapor-phase decomposition within the process chamber 201. Further, this is possible because the film formation inhibition layer is formed over the entire surface of the conductive film, while many areas on the surface of the insulating film do not include the film formation inhibition layer formed thereon. Further, this is possible because Si—OH terminations are formed over the entire surface of the insulating film, while many areas on the surface of the conductive film do not include Si—OH terminations formed thereon.

The processing condition during the supply of the precursor and catalyst in this step is exemplified as follows:

Processing temperature: room temperature (25 degrees C.) to 200 degrees C., particularly 25 to 150 degrees C.;

Processing pressure: 13 to 13330 Pa, particularly 13 to 4000 Pa;

Precursor supply flow rate: 0.001 to 2 slm;

Catalyst supply flow rate: 0.001 to 2 slm;

Inert gas supply flow rate (for each gas supply pipe): 0 to 20 slm; and

Each gas supply time: 0.1 to 60 seconds, particularly 10 to 50 seconds.

After the first layer is selectively formed on the surface of the insulating film, the valves 243b and 243d are closed, stopping the supply of the precursor and catalyst into the process chamber 201, respectively. Then, through the same processing procedures and processing condition as those in the above-described purge, a residual gaseous substance, etc. in the process chamber 201 is excluded from the interior of the process chamber 201 (purge). In addition, a processing temperature during purge in this step may be the same as the processing temperature during the supply of the precursor and catalyst.

As for the precursor, a halogen-free precursor containing alkoxy groups, containing alkoxy groups and amino groups, or containing hydride groups (H group) and amino groups may be used. Herein, halogens include chlorine (Cl), fluorine (F), bromine (Br), iodine (I), etc.

The alkoxy groups refer to 1-valence functional groups with a bonded structure of alkyl groups (R) and oxygen (O) and are represented by the structural formula —OR. Examples of the alkoxy groups include methoxy group (—OMe), ethoxy group (—OEt), propoxy group (—OPr), butoxy group (—Obu), etc. The alkoxy groups may be straight-chain alkoxy groups, or branched alkoxy groups such as isopropoxy group (—OiPr), isobutoxy group (—OiBu), etc. Further, examples of the aforementioned alkyl groups include methyl group (-Me), ethyl group (-Et), propyl group (—Pr), butyl group (-Bu), etc. The alkyl groups may be straight-chain alkyl groups, or branched alkyl groups such as isopropyl group (-iPr), isobutyl group (-iBu), secondary butyl group (-secBu), tertiary butyl group (-tertBu), etc.

The amino groups refer to 1-valence functional groups with a structure obtained by removing hydrogen (H) from any of ammonia ($NH_3$), primary amine, and secondary amine, and are represented by the structural formula —$NH_2$, —NHR, or —NRR'. In other words, the term "amino groups" as used herein includes substituted amino groups. In the structural formula, R and R' indicate alkyl groups including methyl group (-Me), ethyl group (-Et), propyl group (—Pr), butyl group (-Bu), etc. R and R' may be straight-chain alkyl groups, or the above-described branched alkyl groups. R and R' may be the same alkyl groups or different alkyl groups.

As for the precursor, for example, $Si(OEt)_4$, $Si(OMe)_4$, $Si(NMe_2)(OMe)_3$, $Si(NMe_2)_2(OMe)_2$, $Si(NMe_2)_3(OMe)$, $Si(NMe_2)(OEt)_3$, $Si(NMe_2)_2(OEt)_2$, $Si(NMe_2)_3(OEt)$, $Si(NEt_2)(OMe)_3$, $Si(NEt_2)(OEt)_3$, $SiH(NMe_2)_3$, $SiH_2(NEt_2)_2$, $SiH_2(NHt-Bu)_2$, $Si(pyrrolidine)(OMe)_3$, $Si(pyrrolidine)_2(OMe)_2$, $Si(pyrrolidine)_3(OMe)$, $SiH_3N(iPr)_2$, $SiH_3N(iBt)_2$, etc. may be used. One or more of these may be used as the precursor. In addition, if the precursor contains amino groups, as well as alkoxy groups, it is possible to proceed the above-described reaction without supplying the catalyst in the precursor supply step.

As for the catalyst, cyclic amines or chain amines, which contain carbon (C), nitrogen (N), and hydrogen (H) and possess an acid dissociation constant (pKa) of the conjugate acid exceeding the acid dissociation constant of the conjugate acid of pyridine ($C_5H_5N$, pKa=5.67), may be used. In addition, it is more desirable to use cyclic amines or chain amines with an acid dissociation constant of the conjugate acid equal to or greater than 10 as the catalyst. In addition, the pKa values of various catalysts herein indicate the pKa values at 25 degrees C.

As for the catalyst, for example, piperazine ($C_4H_{10}N_2$, pKa=9.80), pyrrolidine ($C_4H_9N$, pKa=11.3), piperidine ($C_5H_{11}N$, pKa=11.12), 1,1,3,3-tetramethylguanidine ($C_5H_{13}N_3$, pKa=13.6), 1-methylpiperidine ($C_6H_{13}N$, pKa=10.08), diazabicyclononene ($C_7H_{12}N_2$, pKa=12.7), 2,5-dimethylpyrrolidine ($C_6H_{13}N$, pKa=11.4), 1-methylpyrrolidine ($C_5H_{11}N$, pKa=10.3), tetramethylpyrrolidine ($C_8H_{17}N$, pKa=12.2), triethylamine (($C_2H_5)_3N$, pKa=10.75), trimethylamine (($CH_3)_3N$, pKa=9.8), diethylamine (($C_2H_5)_2NH$, pka=10.9), dimethylamine (($CH_3)_2NH$, pKa=10.73), monoethylamine (($C_2H_5$) $NH_2$, pka=10.6), monomethylamine (($CH_3$) $NH_2$, pKa=10.6), their derivatives, etc. may be used. Further, for example, amines represented by the general formula $NR^1R^2R^3(R^1=C_nH_{2n+1}$ (n≥1), $R^2$, $R^3=C_mH_{2m+1}(m≥0))$ may also be used as the catalyst. One or more of these may be used as the catalyst. In addition, it is more desirable that the catalyst be non-aromatic amines. This applies similarly to the oxidizing agent supply step described later.

[Oxidizing Agent Supply Step]

After completion of the precursor supply step, an oxidizing agent (oxidizing gas) and a catalyst (catalytic gas) are supplied as film formation agents to the wafer 200, i.e., the wafer 200 after the selective formation of the first layer on the surface of the insulating film.

Specifically, the valves 243c and 243d are opened to flow the oxidizing agent and catalyst into the gas supply pipes 232c and 232d, respectively. The oxidizing agent and catalyst are regulated in flow rate by the MFCs 241c and 241d, respectively, are supplied into the process chamber 201 through the nozzles 249c and 249a, are mixed within the process chamber 201, and are exhausted from the exhaust port 231a. At this time, the oxidizing agent and catalyst are supplied to the wafer 200 from the side of the wafer 200 (oxidizing agent+catalyst supply). At this time, it is also permissible to open the valves 243f to 243h to supply an inert gas into the process chamber 201 through the respective nozzles 249a to 249c.

By supplying the oxidizing agent and catalyst to the wafer 200 under a processing condition described later, it becomes possible to oxidize at least a part of the first layer formed on the surface of the insulating film in the precursor supply step. Thus, a second layer is formed on the surface of the insulating film by oxidizing the first layer.

In this step, by supplying the catalyst along with the oxidizing agent, it becomes possible to proceed the above-described reaction under a non-plasma atmosphere and under a low-temperature condition described later. Thus, by forming the second layer under a non-plasma atmosphere and under a low-temperature condition described later, it becomes possible to maintain the molecules or atoms constituting the film formation inhibition layer formed on the surface of the conductive film without causing the disappearance (desorption) thereof from the surface of the conductive film.

The processing condition during the supply of the oxidizing agent and catalyst in this step is exemplified as follows:

Processing temperature: room temperature (25 degrees C.) to 200 degrees C., particularly 25 to 150 degrees C.;
    Processing pressure: 13 to 13300 Pa, particularly 133 to 13332 Pa;
    Oxidizing agent supply flow rate: 0.001 to 10 slm;
    Catalyst supply flow rate: 0 to 2 slm;
    Inert gas supply flow rate (for each gas supply pipe): 0 to 20 slm; and
    Each gas supply time: 10 to 300 seconds, particularly 30 to 200 seconds.

In addition, it is desirable to supply the oxidizing agent to the wafer 200 for a longer time in the oxidizing agent supply step compared to a time of supplying the precursor to the wafer 200 in the precursor supply step. In addition, it is desirable to maintain a higher processing pressure when supplying the oxidizing agent to the wafer 200 in the oxidizing agent supply step compared to a processing pressure when supplying the precursor to the wafer 200 in the precursor supply step. As such, by controlling a balance between the processing condition in the precursor supply step and the processing condition in the oxidizing agent supply step, the above-described reaction occurring in the precursor supply step and the above-described reactions occurring in the oxidizing agent supply step may be induced more effectively.

After the first layer formed on the surface of the insulating film is oxidized and changed (transformed) into the second layer, the valves 243c and 243d are closed, stopping the supply of the oxidizing agent and catalyst into the process chamber 201, respectively. Then, through the same processing procedures and processing condition as those in the above-described purge, a residual gaseous substance, etc. in the process chamber 201 is excluded from the interior of the process chamber 201 (purge). In addition, a processing temperature during purge in this step may be the same as the processing temperature during the supply of the oxidizing agent and catalyst.

As for the oxidizing agent, for example, gases containing oxygen (O) and hydrogen (H) may be used. Examples of the gases containing O and H include water vapor ($H_2O$ gas), hydrogen peroxide ($H_2O_2$) gas, hydrogen ($H_2$) gas+oxygen ($O_2$) gas, and $H_2$ gas+ozone ($O_3$) gas. One or more of these gases containing O and H may be used as the oxidizing agent.

In addition, the simultaneous mention of two gases such as "$H_2$ gas+$O_2$ gas" herein refers to a mixed gas of $H_2$ gas and $O_2$ gas. When supplying a mixed gas, two gases may be mixed (pre-mixed) in a supply pipe before being supplied into the process chamber 201. Alternatively, two gases may be separately supplied into the process chamber 201 from different supply pipes and may be mixed (post-mixed) within the process chamber 201.

As for the catalyst, for example, various catalysts similar to those exemplified in the above-described precursor supply step may be used.

[Predetermined Number of Repetitions]

Figure 5D:
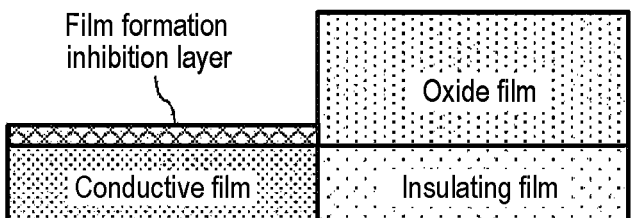
FIG. 5D is a cross-sectional schematic diagram illustrating the surface portion of the wafer after a film is selectively formed on a surface of the insulating film, through a film formation step performed at the state of FIG. 5C.

By performing a cycle, which performs the above-described precursor supply step and oxidizing agent supply step asynchronously, i.e., without synchronization, a number of times (n times, where n is an integer greater than or equal to 1), it is possible to selectively (preferentially) form an oxide film on the surface of the insulating film among the conductive film and insulating film, as illustrated in FIG. 5D. For example, when the above-described precursor, oxidizing agent, and catalyst are used, a SiO film may be selectively grown as the oxide film on the surface of the insulating film. It is desirable to repeat the above-described cycle multiple times. In other words, by setting a thickness of a second layer formed per cycle to be thinner than a desired film thickness, the above-described cycle may be repeated multiple times until a thickness of the oxide film, which is formed by stacking the second layer, reaches the desired film thickness.

As described above, by performing a predetermined number of the above-described cycle, the oxide film may be selectively grown on the surface of the insulating film. At this time, growth of an oxide film on the surface of the conductive film may be prevented since the film formation inhibition layer is formed on the surface of the conductive film. In other words, multiple repetitions of the above-described cycle may promote the growth of the oxide film on the surface of the insulating film while preventing the growth of the oxide film on the surface of the conductive film.

In addition, during the implementation of each step described above, the film formation inhibition layer formed on the surface of the conductive film is maintained on the surface of the conductive film as described above, thereby preventing the growth of the oxide film on the surface of the conductive film. However, in a case where the formation of the film formation inhibition layer on the surface of the conductive film becomes insufficient due to some factors, there may be a slight formation and growth of the oxide film on the surface of the conductive film. However, even in this case, a thickness of the oxide film formed on the surface of the conductive film is much thinner than the thickness of the oxide film formed on the surface of the insulating film. "Selective growth with high selectivity" as used herein includes a case where no oxide film is formed on the surface of the conductive film while the oxide film is formed on the surface of the insulating film, as well as a case where an extremely thin oxide film is formed on the surface of the conductive film while a much thicker oxide film is formed on the surface of the insulating film.

It is desirable to perform the cleaning step, modification step, and film formation step within the same process chamber (in-situ). As a result, after the surface of the wafer 200 is made clean by the cleaning step (after the natural oxide film formed on the surface of the wafer 200 is removed), the modification step and film formation step may be performed without exposing the wafer 200 to the atmosphere, i.e., while keeping the surface of the wafer 200 clean, thereby enabling an appropriate selective formation of the oxide film on the surface of the insulating film. In other words, by performing each step described above within the same process chamber (in-situ), it becomes possible to achieve the selective growth with high selectivity. However, in a case where the natural oxide film is removed from the surface of the wafer 200 in advance, the cleaning step may be omitted. In this case, the modification step and film formation step may be performed within the same process chamber (in-situ), thereby enabling the selective growth with high selectivity. In addition, if it is possible to properly maintain the surface of the wafer 200 after performing each step, the cleaning step, modification step, and film formation step may be performed in different process chambers (ex-situ).

(Heat Treatment Step)

After the film formation step, heat treatment is performed on the wafer 200, i.e., the wafer 200 with the oxide film selectively formed on the surface of the insulating film. At this time, it is desirable to regulate the output of the heater 207 so that the temperature inside the process chamber 201, i.e., the temperature of the wafer 200 where the oxide film is selectively formed on the surface of the insulating film, is equal to or higher than, desirably higher than, the temperature of the wafer 200 in each step described above.

Figure 5E:
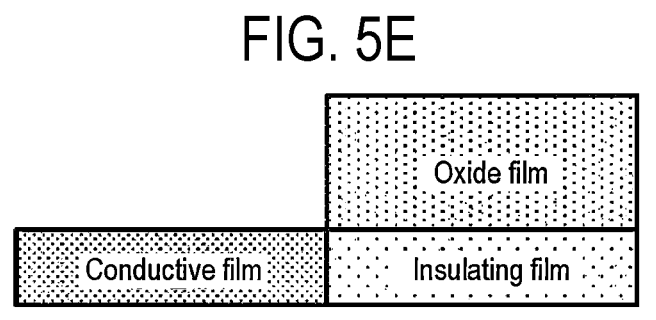

Heat treatment (annealing treatment) on the wafer 200 may remove impurities contained in the oxide film formed on the surface of the insulating film in the film formation step, or may repair defects. Further, annealing treatment on the wafer 200 may remove or neutralize the film formation inhibition layer formed on the surface of the conductive film. FIG. 5E illustrates a surface portion of the wafer 200 after removing the film formation inhibition layer from the surface of the conductive film.

In addition, this step may be performed with the supply of an inert gas into the process chamber 201, or with the supply of a reactive substance such as an oxidizing agent (oxidizing gas). In this case, the reactive substance such as the inert gas or the oxidizing agent (oxidizing gas) is also referred to as an "assisting substance". By supplying the assisting substance, it is possible to efficiently and effectively perform the removal of impurities contained in the oxide film formed on the surface of the insulating film, or the repair of defects, and to efficiently and effectively remove or neutralize the film formation inhibition layer formed on the surface of the conductive film. In addition, annealing treatment may be omitted if the removal of impurities or the repair of defects is not needed for the oxide film formed on the surface of the insulating film, or if the removal or neutralization of the film formation inhibition layer formed on the surface of the conductive film is not needed.

A processing condition during heat treatment in the heat treatment step is exemplified as follows:

Processing temperature: 120 to 500 degrees C., particularly 300 to 400 degrees C.;

Processing pressure: 1 to 120000 Pa;

Processing time: 1 to 18000 seconds; and

Assisting substance supply flow rate: 0 to 50 slm.

In addition, if the conductive film is a Cu film, it is desirable to set the processing temperature during heat treatment as described above, but if the conductive film is a film other than a Cu film, the processing temperature during heat treatment may be set to, for example, the range of 120 to 800 degrees C., particularly 300 to 650 degrees C.

(After-Purge and Atmospheric Pressure Recovery)

After the heat treatment step is completed, an inert gas as a purge gas is supplied into the process chamber 201 from the respective nozzles 249a to 249c, and is exhausted from the exhaust port 231a. This allows the interior of the process chamber 201 to be purged, removing any residues such as gases and reaction by-products remaining in the process chamber 201 from the interior of the process chamber 201 (after-purge). Subsequently, the atmosphere in the process chamber 201 is replaced with the inert gas (inert gas replacement), and the pressure inside the process chamber 201 is restored to normal pressure (atmospheric pressure recovery).

(Boat Unloading and Wafer Discharging)

Subsequently, the seal cap 219 is lowered by the boat elevator 115, opening the lower end of the manifold 209. Then, the processed wafer 200 is unloaded from the lower end of the manifold 209 to an outside of the reaction tube 203 while being supported by the boat 217 (boat unloading). After the boat unloading, the shutter 219s is moved, so that the opening at the lower end of the manifold 209 is sealed by the shutter 219s via the O-ring 220c (shutter closing). The processed wafer 200 is unloaded to the outside of the reaction tube 203, and thereafter, is taken out from the boat 217 (wafer discharging).

(3) Effects of the Embodiments

According to the embodiments, one or more of following effects are obtained.

(a) In the film formation step, by supplying the halogen-free precursor, the oxidizing agent, and the catalyst under a non-plasma atmosphere, it is possible to prevent the corrosion of the conductive film caused by reactions between substances, such as the precursor used or by-products generated during selective growth, and the conductive film exposed on the surface of the wafer 200. This may prevent a decrease in device reliability. Further, it is possible to prevent a difficulty in selective growth caused by reactions between the precursor or by-products and the conductive film exposed on the surface of the wafer 200.

(b) The presence of alkoxy groups in the precursor enables film formation on the insulating film under the low-temperature condition described above. Further, the presence of amino groups in the precursor allows the precursor to be chemically adsorbed onto the insulating film without using the catalyst, making it possible to form a film on the insulating film under the low-temperature condition described above.

(c) By using, as the precursor, any of the following: $Si(OMe)_4$, $Si(NMe_2)(OMe)_3$, $Si(NMe_2)_2(OMe)_2$, $Si(NMe_2)_3(OMe)$, $Si(NMe_2)(OEt)_3$, $Si(NMe_2)_2(OEt)_2$, $Si(NMe_2)_3(OEt)$, $Si(NEt_2)(OMe)_3$, $Si(NEt_2)(OEt)_3$, $SiH(NMe_2)_3$, $SiH_2(NEt_2)_2$, $SiH_2(NHt\text{-}Bu)_2$, $Si(pyrrolidine)(OMe)_3$, $Si(pyrrolidine)_2(OMe)_2$, and $Si(pyrrolidine)_3(OMe)$, it is possible to avoid generation of by-products such as hydrogen chloride (HCl) during selective growth. Further, it is possible to prevent reactions between the precursor and the conductive film, reactions between the conductive film and by-products such as HCl, and corrosion of the conductive film due to the precursor or by-products such as HCl during selective growth.

(d) By using cyclic amines or chain amines with an acid dissociation constant of the conjugate acid exceeding the acid dissociation constant of the conjugate acid of pyridine, it is possible to prevent reactions between the catalyst and the conductive film and corrosion of the conductive film due to the catalyst. Further, by using cyclic amines or chain amines with an acid dissociation constant of the conjugate acid equal to or greater than 10, it is possible to sufficiently prevent reactions between the catalyst and the conductive film and the corrosion of the conductive film due to the catalyst.

(e) In the film formation step, by performing the cycle in which the precursor supply step and the oxidizing agent supply step are performed asynchronously a predetermined number of times, and by supplying the catalyst to the wafer 200 in any of the precursor supply step and the oxidizing agent supply step, it is possible to achieve selective growth with good controllability under the low-temperature condition described above.

(f) Even when the film formation inhibition layer is formed on the surface of the conductive film among the conductive film and insulating film by performing the modification step before the film formation step, there is a possibility that the precursor used or by-products generated during selective growth may reach the conductive film through gaps between molecules constituting the film formation inhibition layer. Even in that case, it is possible to prevent the precursor or by-products, which reached the conductive film through the gaps between the molecules constituting the film formation inhibition layer, from reacting with the conductive film and corroding the conductive film. This may prevent a decrease in device reliability. Further, even in that case, it is possible to prevent the precursor or by-products, which reached the conductive film through the gaps between the molecules constituting the film formation inhibition layer, from reacting with the conductive film, and making selective growth difficult due to desorption of the molecules of the film formation inhibition layer from the surface of the conductive film.

(g) In the modification step, by setting the reactivity between the modifying agent and the surface of the conductive film to be higher than the reactivity between the modifying agent and the insulating film, it is possible to selectively form the film formation inhibition layer on the surface of the conductive film among the conductive film and insulating film.

(h) The above-described effects may be similarly achieved even when selectively using any predetermined substance (gaseous substance or liquid substance) from the cleaning agent group, modifying agent group, precursor group, oxidizing agent group, catalyst group, and inert gas group described above.

(4) Modifications

The substrate processing sequence of the embodiments may be modified as illustrated in the following modifications. These modifications may be combined arbitrarily. Unless otherwise specified, the processing procedures and processing condition for each step in each modification may be the same as the processing procedures and processing condition in each step of the above-described substrate processing sequence.

Modification 1

Figure 6:
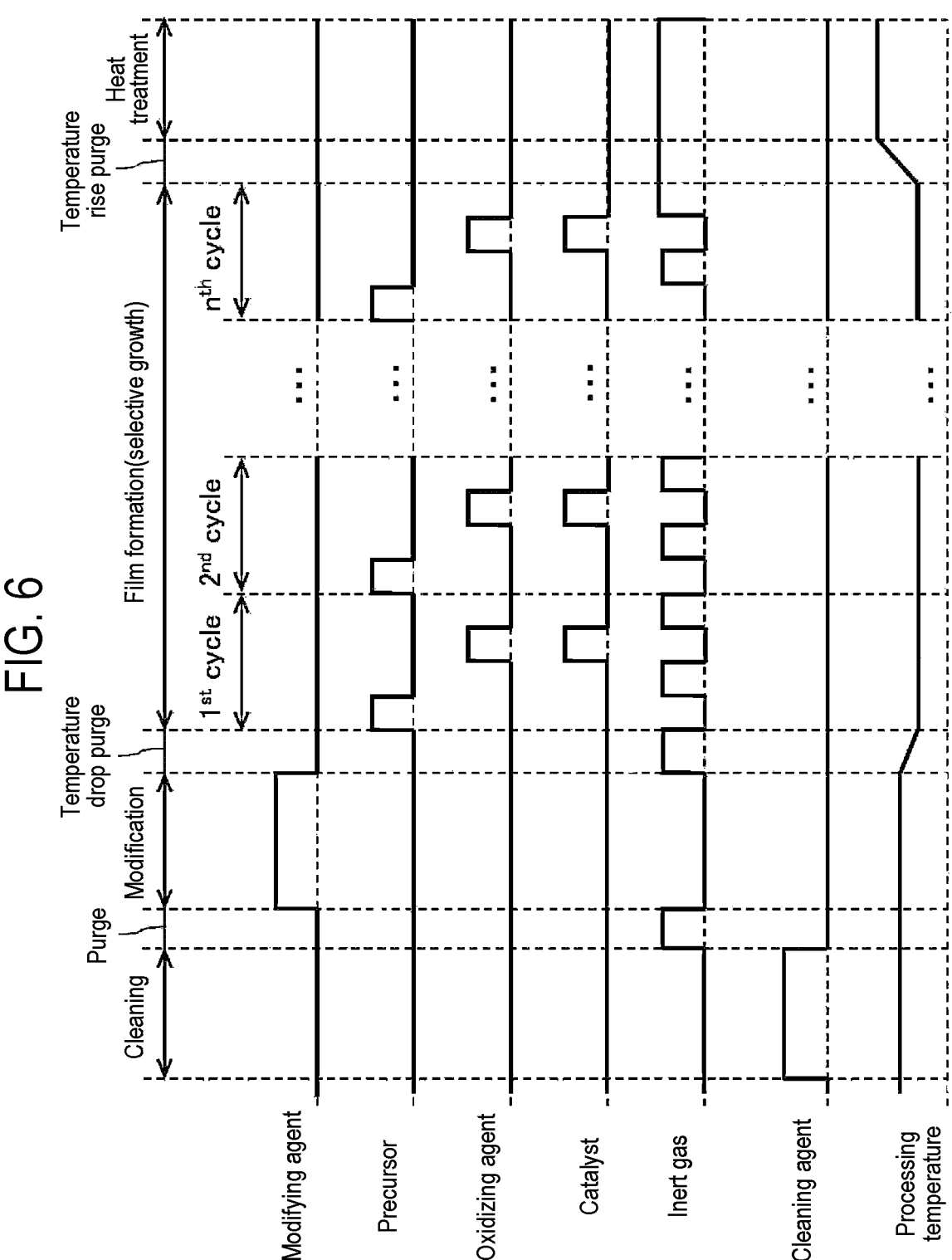
FIG. 6 is a diagram illustrating a processing sequence in Modification 1 of the present disclosure.

While an example of supplying the catalyst along with the precursor in the precursor supply step is described in the processing sequence as illustrated in FIG. 4, in the processing sequence as illustrated in FIG. 6 and described below, it is permissible to supply the precursor as a reactive gas to the wafer 200 without supplying the catalyst in the precursor supply step. At this time, it is also permissible to supply an inert gas along with the precursor.

Cleaning Agent→Modifying Agent→(Precursor→Oxidizing Agent+Catalyst)×$n$

In particular, if the precursor contains amino groups, it is possible to selectively chemically adsorb at least a part of the molecular structure of the molecules constituting the precursor onto the surface of the insulating film while preventing the chemical adsorption of at least a part of the molecular structure of the molecules constituting the precursor onto the surface of the conductive film, without supplying the catalyst, even under the same processing condition as the processing condition in the above-described embodiments.

In this case, it is particularly desirable to supply the oxidizing agent to the wafer 200 for a longer time in the oxidizing agent supply step compared to the time of supplying the precursor to the wafer 200 in the precursor supply step. Further, in this case, it is particularly desirable to maintain a higher processing pressure when supplying the oxidizing agent to the wafer 200 in the oxidizing agent supply step compared to the processing pressure when supplying the precursor to the wafer 200 in the precursor supply step. As such, by controlling the balance between the processing condition in the precursor supply step and the processing condition in the oxidizing agent supply step, it is possible to more effectively induce the above-described reaction in the precursor supply step and the above-described reaction in the oxidizing agent supply step, even without supplying the catalyst along with the precursor. In addition, this effect is particularly pronounced when the precursor contains both alkoxy groups and amino groups.

The same effects as those in the above-described embodiments may also be obtained in Modification 1. Further, Modification 1 enables a significant reduction in the amount of catalyst used in the film formation step. Further, this allows for further prevention of reactions between the catalyst and the conductive film and the corrosion of the conductive film by the catalyst.

Modification 2

Figure 7:
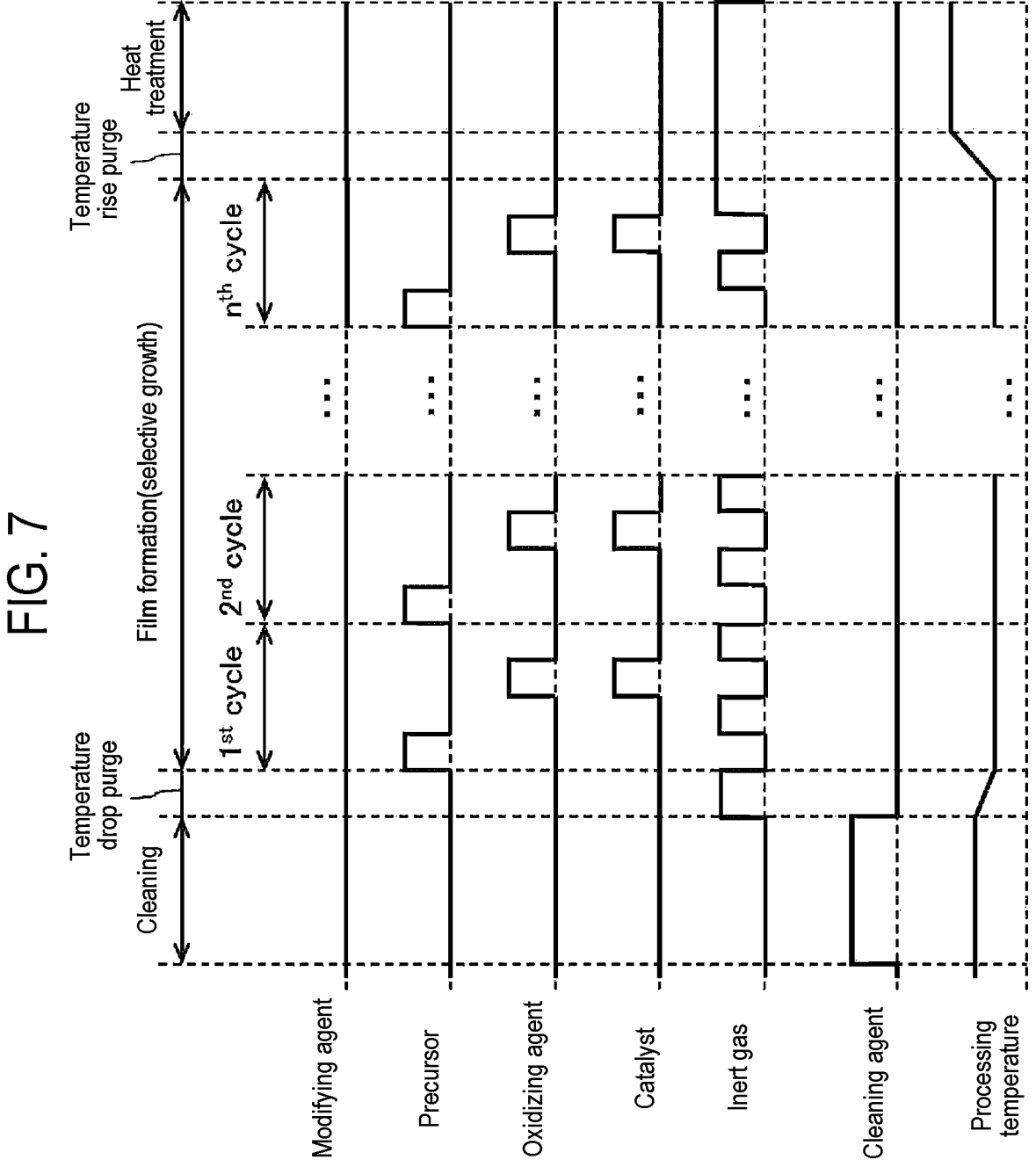
FIG. 7 is a diagram illustrating a processing sequence in Modification 2 of the present disclosure.

While an example of performing the modification step before the film formation step is described in the processing sequence illustrated in FIG. 4, it is permissible to omit the modification step as in the processing sequence illustrated in FIG. 7 and described below. In addition, similar to Modification 1, the processing sequence illustrated in FIG. 7 and described below illustrates an example of supplying the precursor as a reactive gas to the wafer 200 without supplying the catalyst in the precursor supply step. At this time, it is also permissible to supply an inert gas along with the precursor.

Cleaning Agent→(Precursor→Oxidizing Agent+Catalyst)×$n$

Even when omitting the modification step, i.e., when not forming the film formation inhibition layer on the surface of the conductive film, it is possible to selectively form an oxide film on the surface of the insulating film, among the conductive film and insulating film, by using the above-described precursor, catalyst, and oxidizing agent.

The reason why the oxide film may be selectively formed on the surface of the insulating film even when the film formation inhibition layer is not formed on the surface of the conductive film is because of the presence of Si—OH terminations (adsorption sites) on the surface of the insulating film and the absence of Si—OH terminations on the surface of the conductive film. In other words, the presence of Si—OH terminations on the surface of the insulating film promotes the adsorption of at least a part of the molecular structure of the molecules constituting the precursor onto the surface of the insulating film in the precursor supply step. On the other hand, the absence of Si—OH terminations on the surface of the conductive film may prevent the adsorption of at least a part of the molecular structure of the molecules constituting the precursor onto the surface of the conductive film in the precursor supply step. This lower reactivity between the precursor and the surface of the conductive film compared to the reactivity between the precursor and the surface of the insulating film is one of factors that enable the selective chemical adsorption of at least a part of the molecular structure of the molecules constituting the precursor onto the surface of the insulating film in the precursor supply step. In addition, while a first layer formed on the surface of the insulating film in the precursor supply step may be changed into a second layer in the oxidizing agent supply step, a state where the surface of the second layer contains Si—OH terminations and the surface of the conductive film does not contain Si—OH terminations is maintained. Therefore, the same selective chemical adsorption proceeds in subsequent cycles, similar to the first cycle.

In addition, in this modification, as in the processing sequence described below, it is permissible to supply the catalyst to the wafer 200 in both the precursor supply step and the oxidizing agent supply step, or to supply the catalyst to the wafer 200 in the precursor supply step.

> Cleaning Agent→(Precursor+Catalyst→Oxidizing
> Agent+Catalyst)×$n$

> Cleaning Agent→(Precursor+Catalyst→Oxidizing
> Agent)×$n$

The same effects as those in the above-described embodiments may also be obtained in Modification 2. Further, Modification 2 may result in the complete elimination of the modifying agent since the modification step may be omitted. Furthermore, the omission of the modification step may shorten the total processing time, thereby significantly improving throughput, i.e., the productivity of substrate processing. However, performing the modification step allows for achieving higher selectivity as in the above-described embodiments.

Other Embodiments of Present Disclosure

The embodiments of the present disclosure are specifically described above. However, the present disclosure is not limited to the above-described embodiments and may be changed in various ways without departing from the gist of the present disclosure.

For example, an example in which the conductive film as the first underlying film is made of, for example, a Cu film and the insulating film as the second underlying film is made of, for example, a SiO film is described as a representative example in the above-described embodiments. The conductive film may be other metal-containing films such as cobalt film (Co film), ruthenium film (Ru film), titanium film (Ti film), aluminum film (Al film), molybdenum film (Mo film), tungsten film (W film), titanium nitride film (TiN film), etc. in addition to the Cu film. The conductive film may include one or more of these. The insulating film may be other metal-free films such as silicon oxycarbide film (SiOC film), silicon oxycarbonitride film (SiOCN film), silicon oxynitride film (SiON film), silicon nitride film (SiN film), silicon borocarbonitride film (SiBCN film), silicon boronitride film (SiBN film), silicon borocarbide film (SiBC film), and silicon carbide film (SiC film), in addition to the SiO film. The insulating film may include one or more of these. Particularly notable effects of the above-described embodiments are achieved when the conductive film as the first underlying film includes a metal-containing film and the insulating film as the second underlying film includes a metal-free film. For example, when the conductive film as the first underlying film includes a Cu film and the insulating film as the second underlying film includes the above-described silicon-based insulating film, the effects of the above-described embodiments are particularly pronounced.

It is desirable to prepare recipes used for each processing individually based on the processing contents and to store them in the memory 121c via an electrical communication line or the external memory 123. Then, it is desirable for the CPU 121a to select an appropriate recipe from among multiple recipes stored in the memory 121c based on the processing contents when initiating each processing. This allows for reproducible formation of various types of films with different compositions, qualities, and thicknesses using a single substrate processing apparatus. Further, it may reduce the burden on operators, thus minimizing the risk of operational errors and enabling quick initiation of each processing.

The afore-mentioned recipes may be prepared by creating new ones as well as by modifying existing recipes already installed in the substrate processing apparatus, for example. When modifying recipes, modified recipes may be installed in the substrate processing apparatus via an electrical communication line or a recording medium storing the recipes. Further, existing recipes already installed in the substrate processing apparatus may be directly modified by operating the input/output device 122 of the substrate processing apparatus.

In the above-described embodiments, an example of forming a film using a batch-type substrate processing apparatus capable of processing multiple substrates at once is described. The present disclosure is not limited to the above-described embodiments, and for example, may be suitably applied even when forming a film using a single-wafer type substrate processing apparatus capable of processing one or several substrates at once. Further, in the above-described embodiments, an example of forming a film using a substrate processing apparatus equipped with a hot wall type process furnace is described. The present disclosure is not limited to the above-described embodiments, and may also be suitably applied even when forming a film using a substrate processing apparatus equipped with a cold wall type process furnace.

Even when using these substrate processing apparatuses, it is possible to perform each processing using the same processing procedures and processing condition as those in the above-described embodiments and modifications, and to achieve the same effects as those in the above-described embodiments and modifications.

The above-described embodiments and modifications may be used in combination as appropriate. The processing procedures and processing condition at this time may be the same as the processing procedures and processing condition in the above-described embodiments and modifications, for example.

EXAMPLE

Example 1

A cleaning step, a modification step, and a film formation step are sequentially performed on a wafer with a Cu film as a conductive film and a SiO film as an insulating film exposed on a surface thereof according to the following processing sequence. A cleaning agent, modifying agent, precursor, oxidizing agent, catalyst, and inert gas used are substances that are available in each step as illustrated in the above-described embodiments, respectively. The processing condition for each step is set to the condition capable of realizing each step as in the above-described embodiments.

$$\text{Cleaning Agent} \rightarrow \text{Modifying Agent} \rightarrow (\text{Precursor} \rightarrow \text{Oxidizing Agent} + \text{Catalyst}) \times n$$

Figure 8:
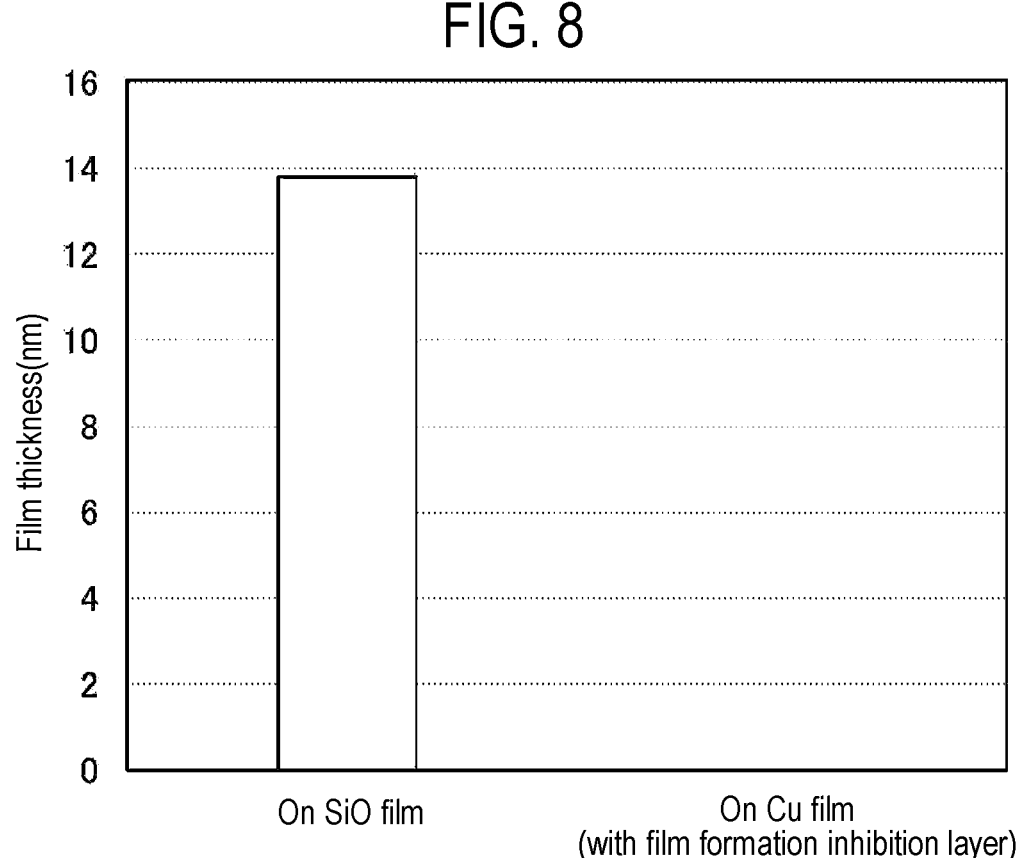
FIG. 8 is a graph illustrating evaluation results in Example 1.

Then, the film thickness of an oxide film (SiO film) formed on the SiO film and the film thickness of an oxide film formed on the Cu film (Cu film with a film formation inhibition layer formed on a surface thereof) are measured, respectively. The results are illustrated in FIG. 8. In FIG. 8, the vertical axis represents the thickness (nm) of the oxide film formed by performing the film formation step, and the horizontal axis represents the underlying films (SiO film and Cu film) of the oxide film.

As illustrated in FIG. 8, the thickness of the oxide film formed on the SiO film is approximately 14 nm. In contrast, no oxide film is formed on the Cu film. Thus, it could be confirmed that performing the modification step before the film formation step according to the film formation sequence illustrated in FIG. 6 may achieve selective growth of the oxide film (SiO film) on the SiO film with very high selectivity.

Example 2

A cleaning step and a film formation step are sequentially performed (without a modification step) on a wafer with a Cu film as a conductive film and a SiO film as an insulating film exposed on a surface of the wafer according to the following processing sequence. A cleaning agent, precursor, oxidizing agent, catalyst, and inert gas used are substances that are available in each step as illustrated in the above-described embodiments. The processing condition for each step is set to the condition capable of realizing each step as in the above-described embodiments.

$$\text{Cleaning Agent} \rightarrow (\text{Precursor} \rightarrow \text{Oxidizing Agent} + \text{Catalyst}) \times n$$

Figure 9:
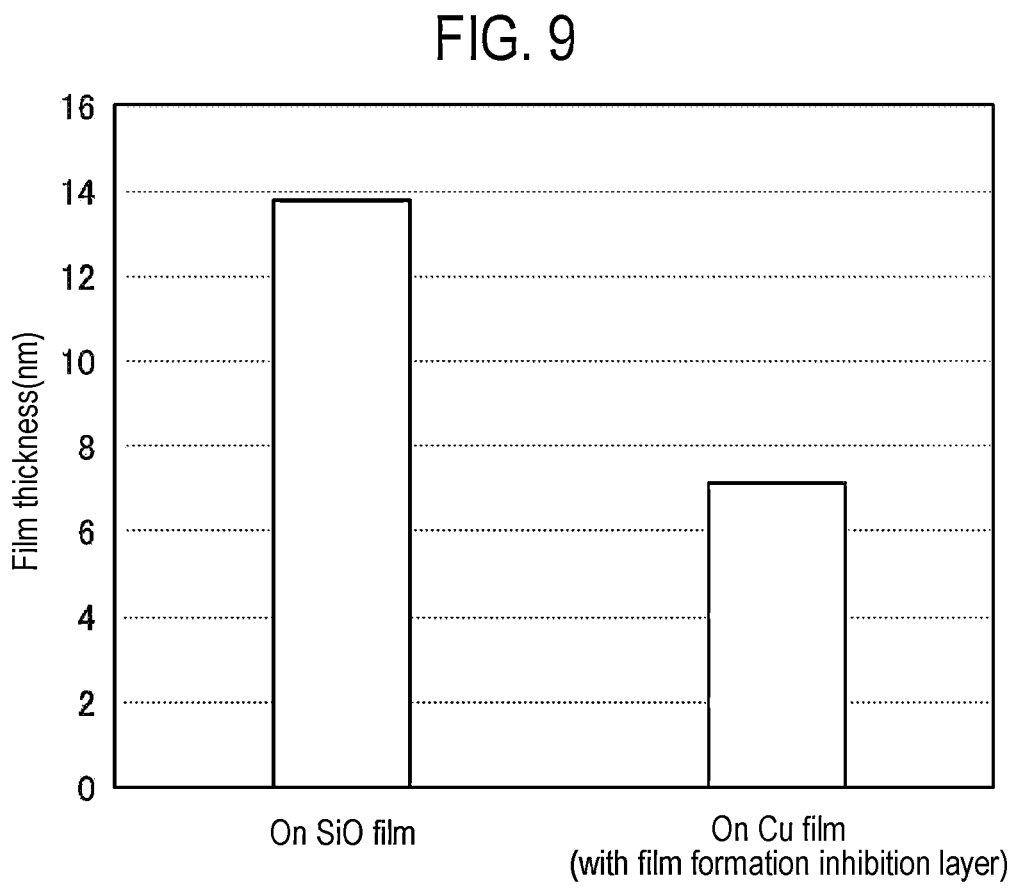

Then, the thickness of an oxide film (SiO film) formed on the SiO film and the thickness of an oxide film formed on the Cu film (Cu film without a film formation inhibition layer formed on a surface thereof) are measured, respectively. The results are illustrated in FIG. 9. In FIG. 9, the vertical axis represents the thickness (nm) of the oxide film formed by performing the film formation step, and the horizontal axis represents the underlying films (SiO film and Cu film) of the oxide film.

As illustrated in FIG. 9, the thickness of the oxide film formed on the SiO film is approximately 14 nm. In contrast, the thickness of the oxide film formed on the Cu film is approximately 7 nm. Thus, it could be confirmed that even Example 2 with the omission of the modification step may achieve the selective growth of the oxide film (SiO film) on the SiO film with predetermined selectivity. In addition, according to this Example, it is inferred that when the thickness of the oxide film formed on the SiO film is relatively thin (e.g., 7 nm or less), the selective growth of the oxide film (SiO film) on the SiO film is possible with the same degree of high selectivity as that when performing the modification step, i.e., while avoiding the formation of the oxide film (SiO film) on the Cu film, despite the omission of the modification step.

According to the present disclosure in some embodiments, it is possible to selectively form a film on a desired surface with high precision.

While certain embodiments are described, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
providing the substrate including a conductive film and an insulating film on a surface of the substrate;
forming a film formation inhibition layer on a surface of the conductive film, among the conductive film and the insulating film, by supplying a modifying agent to the substrate; and
after the act of forming the film formation inhibition layer, forming an oxide film on a surface of the insulating film, among the conductive film and the insulating film, by supplying a halogen-free precursor, an oxidizing agent, and a catalyst to the substrate under a non-plasma atmosphere,
wherein a temperature of the substrate in the act of forming the oxide film is less than a temperature of the substrate in the act of forming the film formation inhibition layer.

2. The method of claim 1, wherein in the act of forming the oxide film, a reactivity between the precursor and a surface of the conductive film is lower than a reactivity between the precursor and the surface of the insulating film.

3. The method of claim 1, wherein the surface of the insulating film contains a Si-OH termination, and a surface of the conductive film does not contain a Si-OH termination.

4. The method of claim 1, wherein the precursor contains an alkoxy group, or contains an alkoxy group and an amino group, or contains a hydride group and an amino group.

5. The method of claim 1, wherein the precursor includes at least one selected from the group of $Si(OEt)_4$, $Si(OMe)_4$, $Si(NMe_2)(OMe)_3$, $Si(NMe_2)_2(OMe)_2$, $Si(NMe_2)_3(OMe)$, $Si(NMe_2)(OEt)_3$, $Si(NMe_2)_2(OEt)_2$, $Si(NMe_2)_3(OEt)$, $Si(NEt_2)(OMe)_3$, $Si(NEt_2)(OEt)_3$, $SiH(NMe_2)_3$, $SiH_2(NEt_2)_2$, $SiH_2(NHt\text{-}Bu)_2$, $Si(pyrrolidine)(OMe)_3$, $Si(pyrrolidine)_2(OMe)_2$, $Si(pyrrolidine)_3(OMe)$, $SiH_3N(iPr)_2$, and $SiH_3N(iBt)_2$.

6. The method of claim 1, wherein the catalyst contains a cyclic amine or chain amine having an acid dissociation constant of a conjugate acid exceeding an acid dissociation constant of a conjugate acid of pyridine.

7. The method of claim 1, wherein the catalyst contains a cyclic amine or chain amine having an acid dissociation constant of a conjugate acid equal to or greater than 10.

8. The method of claim 1, wherein the catalyst includes at least one selected from the group of piperazine, pyrrolidine, piperidine, 1,1,3,3-tetramethylguanidine, 1-methylpiperidine, diazabicyclononene, 2,5-dimethylpyrrolidine, 1-methylpyrrolidine, tetramethylpyrrolidine, triethylamine, trimethylamine, diethylamine, dimethylamine, monoethylamine, monomethylamine, and their derivatives.

9. The method of claim 1, wherein in the act of forming the oxide film, a cycle including supplying the precursor to the substrate and supplying the oxidizing agent to the substrate is performed a predetermined number of times, and the catalyst is supplied to the substrate in at least one selected from the group of the act of supplying the precursor and the act of supplying the oxidizing agent.

10. The method of claim 9, wherein a time for supplying the oxidizing agent to the substrate is set to be longer than a time for supplying the precursor to the substrate, and a pressure of a space where the substrate exists in the act of supplying the oxidizing agent to the substrate is set to be higher than a pressure of a space where the substrate exists in the act of supplying the precursor to the substrate.

11. The method of claim 1, wherein a time for supplying the oxidizing agent to the substrate is set to be longer than a time for supplying the precursor to the substrate, and a pressure of a space where the substrate exists when supplying the oxidizing agent to the substrate is set to be higher than a pressure of a space where the substrate exists when supplying the precursor to the substrate.

12. The method of claim 1, wherein a time for supplying the oxidizing agent to the substrate is set to be longer than a time for supplying the precursor to the substrate.

13. The method of claim 1, wherein a pressure of a space where the substrate exists when supplying the oxidizing agent to the substrate is set to be higher than a pressure of a space where the substrate exists when supplying the precursor to the substrate.

14. The method of claim 1, wherein in the act of forming the film formation inhibition layer, a reactivity between the modifying agent and the surface of the conductive film is higher than a reactivity between the modifying agent and the surface of the insulating film.

15. The method of claim 1, wherein the modifying agent contains a hydrocarbon group, and the film formation inhibition layer contains a hydrocarbon group termination.

16. The method of claim 1, wherein the modifying agent includes at least one selected from the group of a thiol compound and a phosphonic acid compound.

17. The method of claim 1, wherein the conductive film includes a metal-containing film and the insulating film includes a metal-free film.

18. The method of claim 1, wherein the conductive film includes a copper film and the insulating film includes a silicon-based insulating film.

19. A substrate processing apparatus comprising:
a process chamber where a substrate is processed;
a providing device configured to provide the substrate into the process chamber;

a modifying agent supply system configured to supply a modifying agent to the substrate in the process chamber;

a precursor supply system configured to supply a halogen-free precursor to the substrate in the process chamber;

an oxidizing agent supply system configured to supply an oxidizing agent to the substrate in the process chamber;

a catalyst supply system configured to supply a catalyst to the substrate in the process chamber; and a controller configured to be capable of controlling the providing device, the modifying agent supply system, the precursor supply system, the oxidizing agent supply system, and the catalyst supply system to perform a process including:

providing the substrate, including a conductive film and an insulating film on a surface of the substrate, into the process chamber;

forming a film formation inhibition layer on a surface of the conductive film, among the conductive film and the insulating film, by supplying the modifying agent to the substrate; and after the act of forming the film formation inhibition layer, forming an oxide film on a surface of the insulating film, among the conductive film and the insulating film, by supplying the halogen-free precursor, the oxidizing agent, and the catalyst to the substrate under a non-plasma atmosphere, wherein a temperature of the substrate in the act of forming the oxide film is less than a temperature of the substrate in the act of forming the film formation inhibition layer.

20. A non-transitory computer-readable recording medium storing a program that causes, by a computer, a substrate processing apparatus to perform a process comprising:

providing a substrate, including a conductive film and an insulating film on a surface of the substrate, into a process chamber;

forming a film formation inhibition layer on a surface of the conductive film, among the conductive film and the insulating film, by supplying a modifying agent to the substrate; and after the act of forming the film formation inhibition layer, forming an oxide film over a surface of the insulating film, among the conductive film and the insulating film, by supplying a halogen-free precursor, an oxidizing agent, and a catalyst to the substrate under a non-plasma atmosphere, wherein a temperature of the substrate in the act of forming the oxide film is less than a temperature of the substrate in the act of forming the film formation inhibition layer.

* * * * *